(12) United States Patent
Roy

(10) Patent No.: US 12,321,103 B2
(45) Date of Patent: Jun. 3, 2025

(54) SYSTEM AND METHOD OF GENERATING A SET OF ILLUMINATION PATTERNS FOR USE IN A PHOTOMECHANICAL SHAPING SYSTEM

(71) Applicant: CANON KABUSHIKI KAISHA, Tokyo (JP)

(72) Inventor: Nilabh K. Roy, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 765 days.

(21) Appl. No.: 17/556,441

(22) Filed: Dec. 20, 2021

(65) Prior Publication Data

US 2023/0194995 A1  Jun. 22, 2023

(51) Int. Cl.
*G03F 7/00* (2006.01)
*G03F 7/027* (2006.01)

(52) U.S. Cl.
CPC ........ *G03F 7/70625* (2013.01); *G03F 7/0002* (2013.01); *G03F 7/70558* (2013.01); *G03F 7/027* (2013.01)

(58) Field of Classification Search
CPC .... G03F 7/0002; G03F 7/027; G03F 7/70558; G03F 7/70625; G03F 9/7042
See application file for complete search history.

(56) References Cited

U.S. PATENT DOCUMENTS

| | | | |
|---|---|---|---|
| 5,912,773 A | 6/1999 | Barnett et al. | |
| 6,476,986 B2 | 11/2002 | Smith et al. | |
| 6,936,194 B2 | 8/2005 | Watts | |
| 7,157,036 B2 | 1/2007 | Choi et al. | |
| 8,066,930 B2 | 11/2011 | Sreenivasan et al. | |
| 8,076,386 B2 | 12/2011 | Xu et al. | |
| 8,349,241 B2 | 1/2013 | Sreenivasan et al. | |
| 9,952,440 B2 | 4/2018 | Matsumoto | |
| 9,971,249 B1 | 5/2018 | Barnesberger et al. | |
| 2008/0143982 A1 | 6/2008 | Troost et al. | |
| 2010/0096764 A1 | 4/2010 | Lu | |
| 2016/0025992 A1 | 1/2016 | Van Der Zouw et al. | |

(Continued)

OTHER PUBLICATIONS

Chi Zhou, Optimized Mask Image Projection for Large-Area Based Additive Manufacturing Process, Dec. 2011, pp. 77-79, Thesis, University of Southern California, Los Angeles, CA, 2011.

(Continued)

*Primary Examiner* — Peter B Kim
(74) *Attorney, Agent, or Firm* — Daniel Ratoff

(57) ABSTRACT

System and method for generating a set of illumination patterns. Intensity distribution for each pixel in an array of pixels of actinic radiation at a plane of a shaping surface while it is in contact with formable material on a substrate is received. Predicted dosage pattern based on the intensity distribution for each pixel and a set of operational parameters is computed. Set of operational parameters may include sets of: modulation maps; positional shifts of an array of illuminators; duty cycles. Curing dose variation metric based on the predicted dosage pattern is determined. The curing dose variation metric is compared to a threshold. Different sets of operational parameters may be used to create an operational parameters superset. The curing set of operational parameters in the operational parameters superset is selected based on a comparison of the curing dose variation metric to a dose variation threshold.

15 Claims, 14 Drawing Sheets

(56) References Cited

U.S. PATENT DOCUMENTS

| | | |
|---|---|---|
| 2017/0285331 A1 | 10/2017 | Miyaharu et al. |
| 2019/0101823 A1 | 4/2019 | Patel et al. |
| 2020/0249584 A1 | 8/2020 | Socha et al. |
| 2020/0264513 A1* | 8/2020 | Yamamoto ............ G03F 7/0002 |
| 2020/0292935 A1 | 9/2020 | Yoshida |
| 2021/0124274 A1 | 4/2021 | Roy et al. |
| 2021/0181621 A1 | 6/2021 | Fletcher et al. |
| 2021/0302829 A1 | 9/2021 | Roy et al. |
| 2021/0407797 A1 | 12/2021 | Roy et al. |
| 2022/0163893 A1 | 5/2022 | Irving et al. |

OTHER PUBLICATIONS

Chi Zhou, Yong Chen, Additive Manufacturing based on Optimized Mask Video Projection for Improved Accuracy and Resolution, 2011, Journal of Manufacturing Processes, Apr. 2012, 14(2):107-118, Society of Manufacturing Engineers, Elsevier Ltd., Amsterdam, NL, 2012.

* cited by examiner

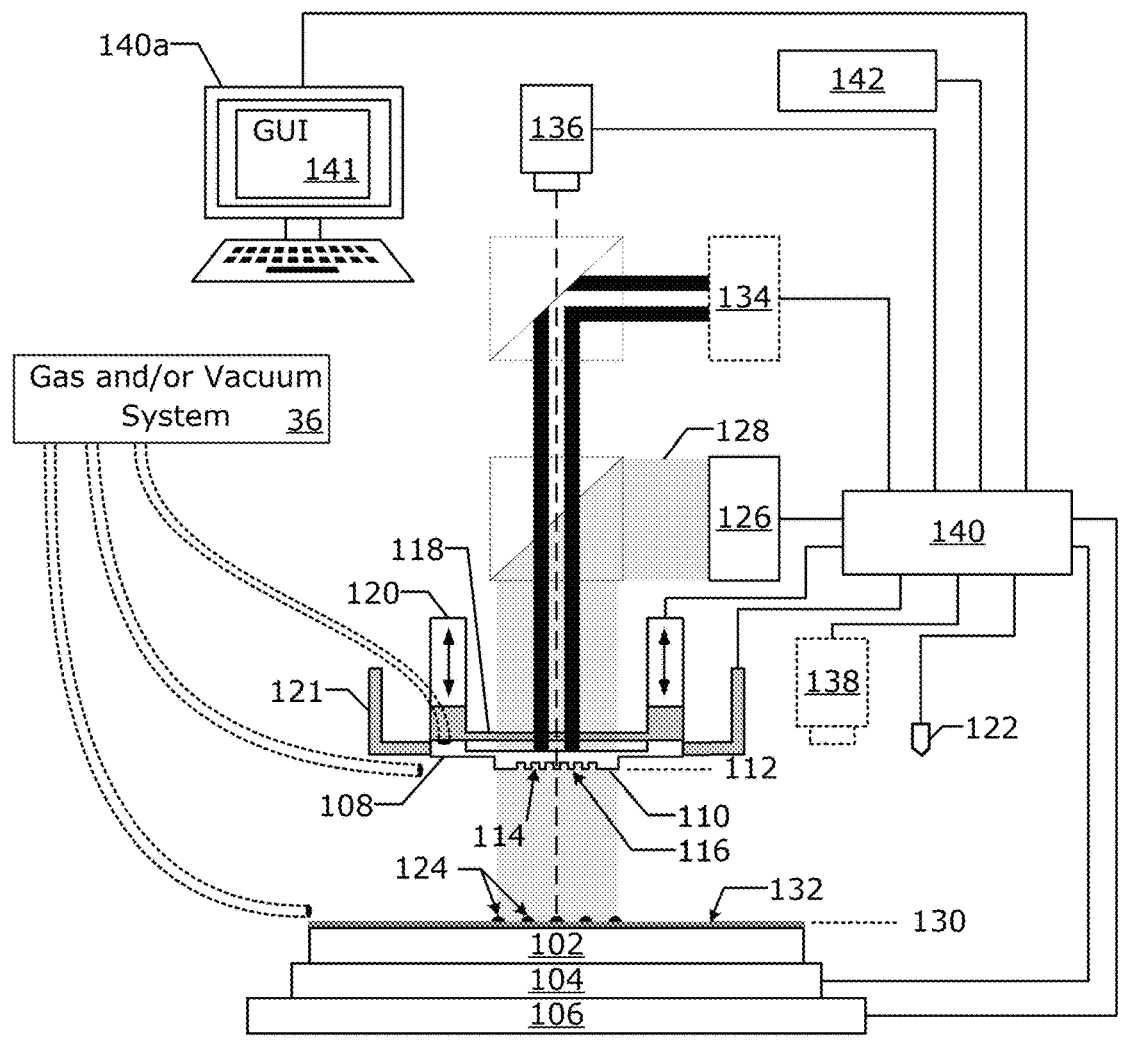
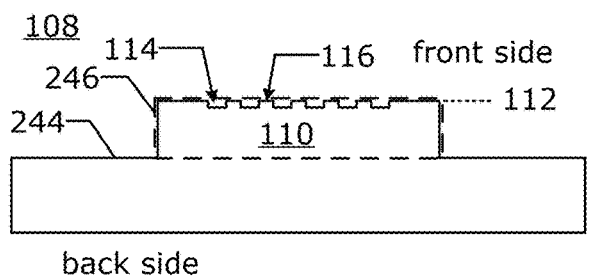
FIG. 2A
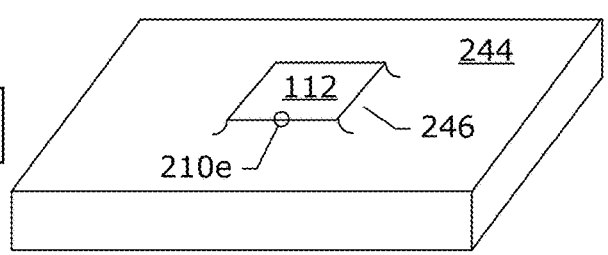
FIG. 2B $I_0(X,Y)$ $I_2(X,Y)$ $I_{1x}(X,Y)$ $I_{1y}(X,Y)$

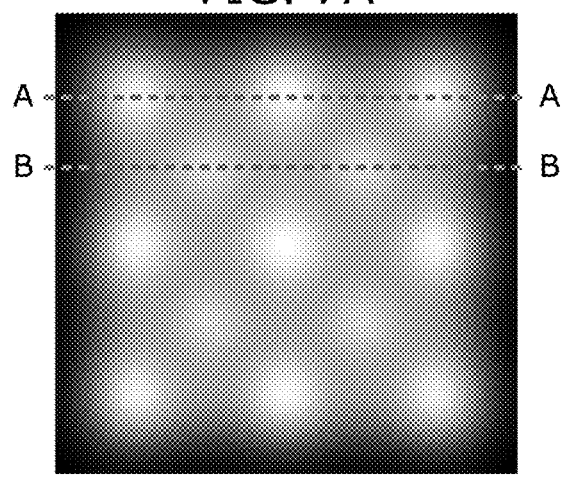
FIG. 7A
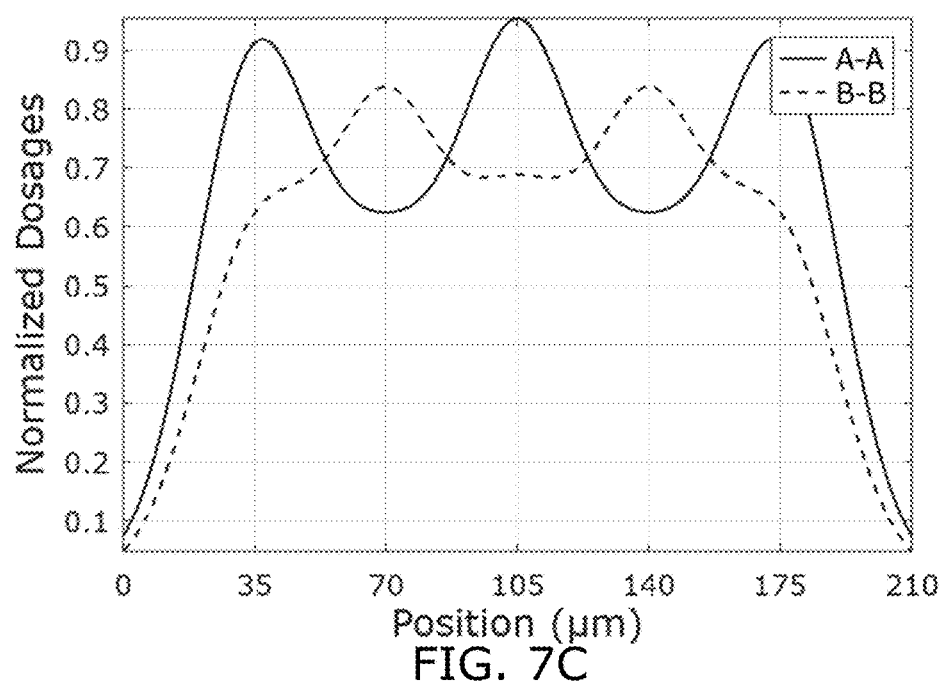
FIG. 7B
FIG. 7C

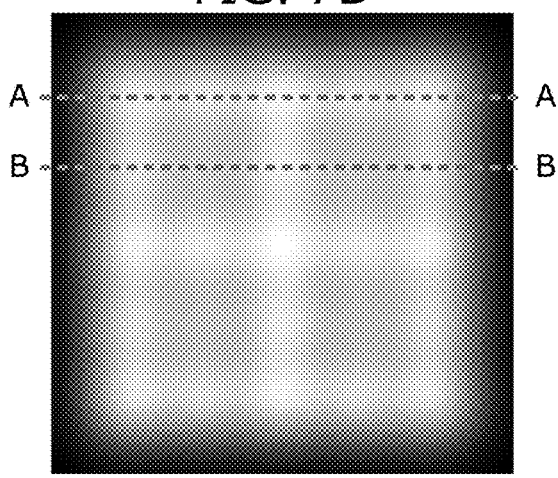
FIG. 7D
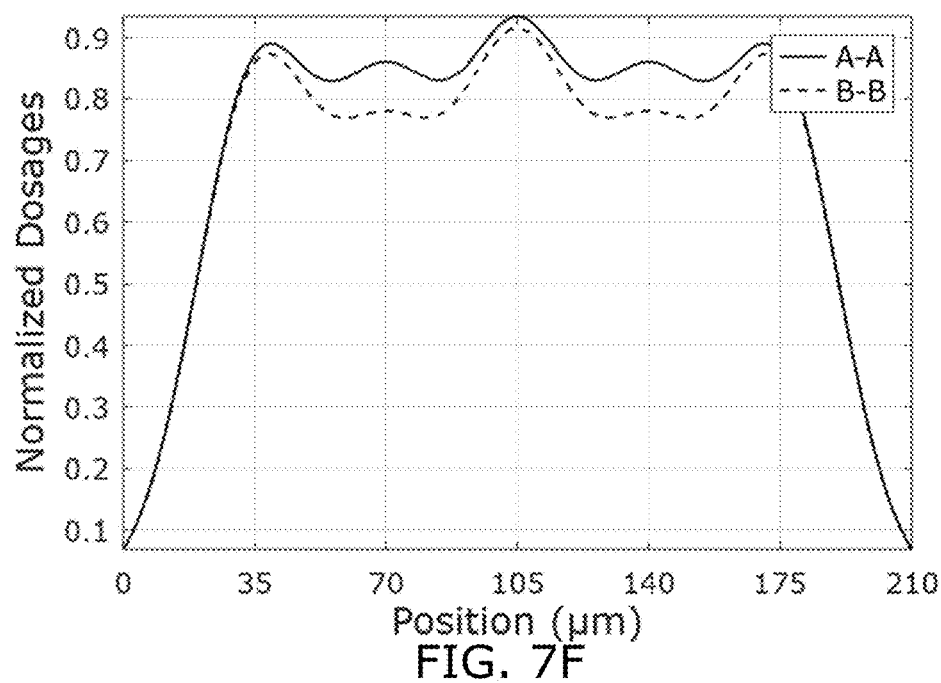
FIG. 7E
FIG. 7F

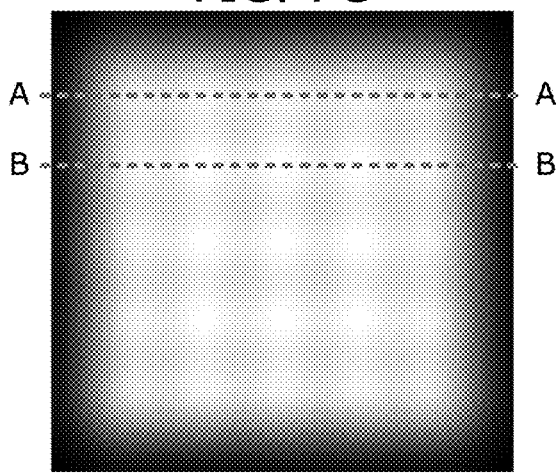
FIG. 7G
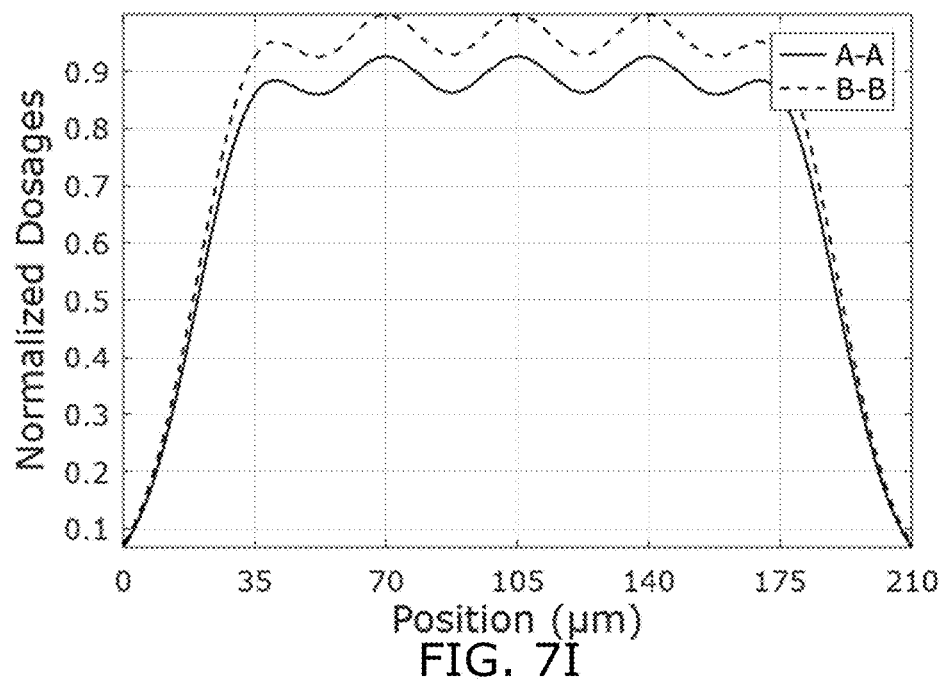
FIG. 7H
FIG. 7I

SYSTEM AND METHOD OF GENERATING A SET OF ILLUMINATION PATTERNS FOR USE IN A PHOTOMECHANICAL SHAPING SYSTEM

BACKGROUND OF INVENTION

Technical Field

The present disclosure relates to photomechanical shaping systems (such as a Nanoimprint Lithography system and/or an Inkjet Adaptive Planarization system). In particular, the present disclosure relates to methods of generating a set of illumination patterns of actinic radiation to be projected through a shaping surface that is in contact with a photopolymerizable formable material.

Description of the Related Art

Nano-fabrication includes the fabrication of very small structures that have features on the order of 100 nanometers or smaller. One application in which nano-fabrication has had a sizeable impact is in the fabrication of integrated circuits. The semiconductor processing industry continues to strive for larger production yields while increasing the circuits per unit area formed on a substrate. Improvements in nano-fabrication include providing greater process control and/or improving throughput while also allowing continued reduction of the minimum feature dimensions of the structures formed.

One nano-fabrication technique in use today is commonly referred to as nanoimprint lithography. Nanoimprint lithography is useful in a variety of applications including, for example, fabricating one or more layers of integrated devices by shaping a film on a substrate. Examples of an integrated device include but are not limited to CMOS logic, microprocessors, NAND Flash memory, NOR Flash memory, DRAM memory, MRAM, 3D cross-point memory, Re-RAM, Fe-RAM, SU-RAM, MEMS, and the like. Exemplary nanoimprint lithography systems and processes are described in detail in numerous publications, such as U.S. Pat. Nos. 8,349,241, 8,066,930, and 6,936,194, all of which are hereby incorporated by reference herein.

The nanoimprint lithography technique disclosed in each of the aforementioned patents describes the shaping of a film on a substrate by the formation of a relief pattern in a formable material (polymerizable) layer. The shape of this film may then be used to transfer a pattern corresponding to the relief pattern into and/or onto an underlying substrate.

The shaping process uses a template spaced apart from the substrate and the formable material is applied between the template and the substrate. The template is brought into contact with the formable material causing the formable material to spread and fill the space between the template and the substrate. The formable liquid is solidified to form a film that has a shape (pattern) conforming to a shape of the surface of the template that is in contact with the formable liquid. After solidification, the template is separated from the solidified layer such that the template and the substrate are spaced apart.

The substrate and the solidified layer may then be subjected to additional processes, such as etching processes, to transfer an image into the substrate that corresponds to the pattern in one or both of the solidified layer and/or patterned layers that are underneath the solidified layer. The patterned substrate can be further subjected to known steps and processes for device (article) fabrication, including, for example, curing, oxidation, layer formation, deposition, doping, planarization, etching, formable material removal, dicing, bonding, and packaging, and the like.

SUMMARY OF THE INVENTION

A first embodiment, may be a method for generating a set of illumination patterns to be passed through a shaping surface using a curing set of operational parameters. The method may comprise (a) receiving an intensity distribution for each pixel in an array of pixels of actinic radiation that is projected at a plane of the shaping surface while it is in contact with formable material on a substrate. The method may further comprise (b) computing a predicted dosage pattern based on the intensity distribution for each pixel and a set of operational parameters. a set of operational parameters may include: a set of modulation maps; a set of positional shifts of an array of illuminators; and a set of duty cycles. The method may further comprise determining a curing dose variation metric based on the predicted dosage pattern. The method may further comprise (d) comparing the curing dose variation metric to a threshold. The method may further comprise (e) performing steps (b)-(d) using different sets of operational parameters to create an operational parameters superset. The method may further comprise (f) selecting the curing set of operational parameters in the operational parameters superset in which the curing dose variation metric is compared to a dose variation threshold.

In an aspect of the first embodiment, the set of duty cycles may vary in each of the set of operational parameters in the operational parameters superset; the set of modulation maps may be identical in the each of the set of operational parameters in the operational parameters superset; and the set of positional shifts may be identical in the each of the set of operational parameters in the operational parameters superset.

In an aspect of the first embodiment, the array of illuminators may be a DMD array illuminated with actinic radiation.

In an aspect of the first embodiment, the array of illuminators may be an LED array that supplies actinic radiation.

The first embodiment, the operational parameters superset may comprise a set of modulation maps and a set of positional shifts of an array of illuminators. The set of modulation maps may comprise: a m×n digital map; a (m−1)×(n−1) digital map; a m×(n−1) digital map; and a (m−1)×n digital map. The set of positional shifts of an array of illuminators may comprise: a zero x-shift and a zero y-shift; a half pitch x-shift and a half pitch y-shift; the half pitch x-shift and the zero y-shift; and the zero x-shift and the half pitch q-shift.

The first embodiment, may further comprise: (g) bringing a shaping surface into contact with formable material on the substrate; (h) shifting the array of illuminators based on a particular element in the set of positional shifts; (i) illuminating the shaping surface based on a particular map in the set of modulation maps for a period of time determined by a particular duty cycle element in the set of duty cycles; (j) repeating steps (h) and (i) for the set of parameters; and (k) separating the shaping surface from the formable material.

The first embodiment may be a method of manufacturing an article, from a substrate on which a film was shaped further comprising: processing the device-yielding substrate; and forming the article from the processed device-yielding substrate.

The first embodiment, may further comprise: transmitting the curing set of operational parameters from a first processor to a controller of a shaping system, that is used by the shaping system to shape surfaces on a substrate.

The first embodiment, may further comprise: receiving a desired dosage pattern; and in aspect of the first embodiment the step (f) of identifying the curing set of operational parameters may further comprise: comparing the predicted dosage pattern to the desired dosage pattern.

In an aspect of the first embodiment the curing dose variation metric $H_a$ may be calculated by:

$$H_a(O_a) = \frac{\left(\max_{A_s}(D_a(X,Y,O_a)) - \min_{A_s}(D_a(X,Y,O_a))\right)}{\max_{A_s}(D_a(X,Y,O_a))};$$

wherein $D_a$ is a simulated dose of the predicted dosage pattern;
wherein $O_a$ is a set of operational parameters; and
wherein $A_s$ is subset range that is within a range of an imprint field.

In an aspect of the first embodiment the $A_s$ is a subset range that is an inset width within edges covered by the set of modulation maps, wherein the inset width is one of: a blur width b of the predicted dosage pattern; and a multiple of the pixel pitch.

In an aspect of the first embodiment the set of modulation maps and the subset range $A_s$ are frame shaped modulation maps.

In an aspect of the first embodiment the frame shaped modulation maps have frame widths that are function of position in the imprint field, wherein the frame widths of the different modulation maps are related to each other.

A second embodiment, may be a system for generating a set of illumination patterns to be passed through a shaping surface using a curing set of operational parameters comprising: a memory; and a processor. The processor may be configured to (a) receive an intensity distribution for each pixel in an array of pixels of actinic radiation that is projected at a plane of the shaping surface while it is in contact with formable material on a substrate. The processor may be further configured to (b) compute a predicted dosage pattern based on the intensity distribution for each pixel and a set of operational parameters. The set of operational parameters may include: a set of modulation maps; a set of positional shifts of an array of illuminators; and a set of duty cycles. The processor may be further configured to (c) determine a curing dose variation metric based on the predicted dosage pattern. The processor may be further configured to (d) compare the curing dose variation metric to a threshold. The processor may be further configured to (e) perform steps (b)-(d) using different sets of operational parameters to create an operational parameters superset. The processor may be further configured to select the curing set of operational parameters in the operational parameters superset in which the curing dose variation metric is compared to a dose variation threshold.

The second embodiment, may further comprise a template chuck configured to hold a template; a substrate chuck configured to hold a substrate; a dispensing system configure to dispense formable material onto a substrate; a first positioning system configured to align a template with a substrate and bring a shaping surface of the template into contact with the formable material on the substrate; an illumination system configured to produce an array of beamlets; and a second positioning system configured to shift the array of beamlets relative to the template by an amount that is less than a pixel width of the array of beamlets. In an aspect of the second embodiment the second positioning system may be configured to shift the array of illuminators based on a particular element in the set of positional shifts of the selected curing set of operational parameters. In an aspect of the second embodiment the illumination system may be configured to illuminate the shaping surface based on a particular map in the set of modulation maps for a period of time determined by a particular duty cycle element in the set of duty cycles of the selected curing set of operational parameters. In an aspect of the second embodiment the second positioning system and the illumination system may be configured to repeat shifting and illuminating for the set of parameters. In an aspect of the second embodiment first positioning system may be configured to separate the shaping surface from the formable material.

The second embodiment, may further comprise a shaping system configured to shape a film on a substrate with a template. The shaping system may be further configured to cure the formable material in contact with the template using the selected curing set of operational parameters.

These and other objects, features, and advantages of the present disclosure will become apparent upon reading the following detailed description of exemplary embodiments of the present disclosure, when taken in conjunction with the appended drawings, and provided claims.

BRIEF DESCRIPTION OF THE FIGURES

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention and are therefore not to be considered limiting of its scope, for the invention may admit to other equally effective embodiments.

FIG. 1 is an illustration of an exemplary nanoimprint lithography system having a template with a mesa spaced apart from a substrate as used in an embodiment.

FIGS. 2A-B are illustrations of an exemplary template that may be used in an embodiment.

FIGS. 7A-I are illustrations of simulated dosage and intensity patterns as used in an embodiment.

Figure 3:
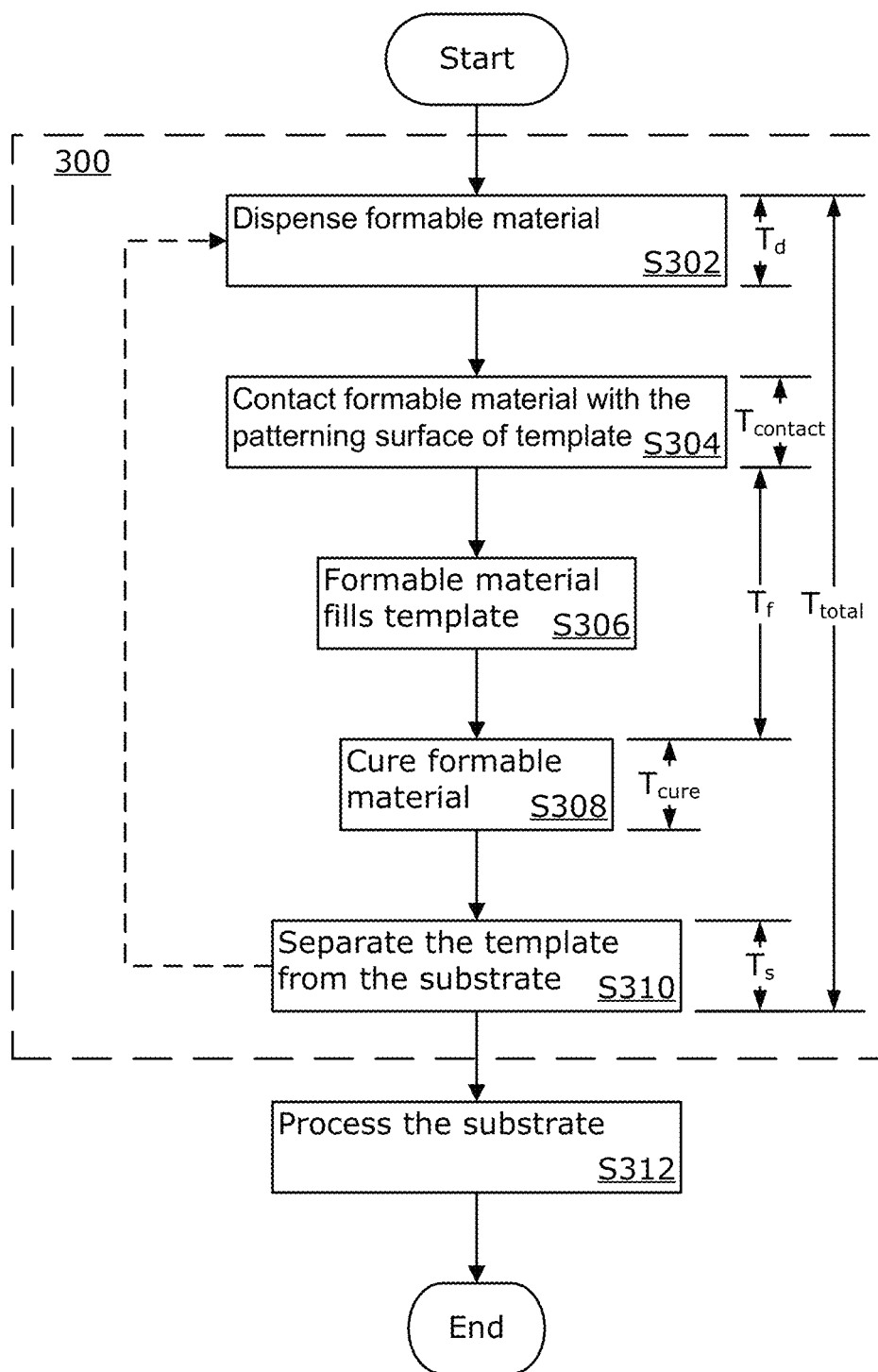
FIG. 3 is a flowchart illustrating an exemplary imprinting method as used in an embodiment.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative exemplary embodiments. It is intended that changes and modifications can be made to the described exemplary embodiments without departing from the true scope and spirit of the subject disclosure as defined by the appended claims.

It should be noted that the following embodiments are not intended to limit the scope of the appended claims. A plurality of features are described in the embodiments. However, not all the combinations of the plurality of features are necessarily essential to the present invention, and the plurality of features may arbitrarily be combined. The terms "a" or "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). Reference to "one embodiment", "certain embodiments", "an embodiment", "an implementation", "an example", "alternative embodiment", or similar terms means that a particular feature, structure, element, or characteristic described in connection with the embodiment is included in at least one embodiment. Thus, the appearances of such phrases or in various places throughout are not necessarily all referring to the same embodiment. Furthermore, the particular features, structures, or characteristics may be combined in any suitable manner in one or more embodiments without limitation, unless otherwise stated.

DETAILED DESCRIPTION

The nanoimprinting lithography technique can be used to shape a film on a substrate from a formable material. The shaping process includes bringing a template into contact with the formable material. The template includes a shaping surface on a mesa that extends above a recessed surface. The template also includes mesa sidewalls that surround the mesa and connect the mesa to the recessed surface. During the shaping process the formable material spreads due to capillary action and other forces such that the formable material spreads toward the mesa sidewalls. Extrusion defects form when formable material wets the mesa sidewalls during the shaping process. After the formable material is exposed to actinic radiation, and the template separates from the formable material, one or more extrusion defects may stay on the substrate and/or template. Non-fill defects form when the formable material does not reach the edge of the mesa or does not fill features within the template. The applicant has found that depending on the size tolerance (from a few 100 nm-tens of µm) for extrusion defects and non-fill defects these defects do not always occur in a repeatable manner (for very small defects) but have a stochastic component. The applicant has found that it is advantageous to minimize the occurrence of both extrusions, under-cure defects, and non-fill defects to improve the yield of the manufacturing process.

The applicant has found that it is possible to reduce the occurrence of these defects if the dosage of the actinic radiation in the regions of these defects is carefully controlled. These defects tend to occur near the mesa sidewalls. The applicant has found that it is helpful to use a frame curing process to cure and/or help cure the areas near the mesa sidewall with a carefully controlled dosage of actinic radiation. The frame curing process may make use of a spatial light modulator that has a limited number of pixels and has less than 100% fill factor.

Specific constraints of the specific spatial light modulator and specific optical system used in the frame curing process places limitations on the adjustability of the distribution of actinic radiation at the imprint plane. What is needed is a means for overcoming these constraints and minimize the occurrence of both extrusion defects, under-cure defects, and non-fill defects.

Nanoimprint System (Shaping System)

FIG. 1 is an illustration of a nanoimprint lithography system 100 in which an embodiment may be implemented. The nanoimprint lithography system 100 is used to produce an imprinted (shaped) film on a substrate 102. The substrate 102 may be coupled to a substrate chuck 104. The substrate chuck 104 may be but is not limited to a vacuum chuck, pin-type chuck, groove-type chuck, electrostatic chuck, electromagnetic chuck, and/or the like.

The substrate 102 and the substrate chuck 104 may be further supported by a substrate positioning stage 106. The substrate positioning stage 106 may provide translational and/or rotational motion along one or more of the x, y, z, θ, ψ, and φ-axes. The substrate positioning stage 106, the substrate 102, and the substrate chuck 104 may also be positioned on a base (not shown). The substrate positioning stage may be a part of a positioning system.

Spaced-apart from the substrate 102 is a template 108. The template 108 may include a body having a mesa (also referred to as a mold) 110 extending towards the substrate 102 on a front side of the template 108. The mesa 110 may have a patterning surface 112 thereon also on the front side of the template 108. The patterning surface 112, also known as a shaping surface, is the surface of the template that shapes the formable material 124. In an embodiment, the patterning surface 112 is planar and is used to planarize the formable material. Alternatively, the template 108 may be formed without the mesa 110, in which case the surface of the template facing the substrate 102 is equivalent to the mold 110 and the patterning surface 112 is that surface of the template 108 facing the substrate 102.

The template 108 may be formed from such materials including, but not limited to, fused-silica, quartz, silicon, organic polymers, siloxane polymers, borosilicate glass, fluorocarbon polymers, metal, hardened sapphire, and/or the like. The patterning surface 112 may have features defined by a plurality of spaced-apart template recesses 114 and/or template protrusions 116. The patterning surface 112 defines a pattern that forms the basis of a pattern to be formed on the substrate 102. In an alternative embodiment, the patterning surface 112 is featureless in which case a planar surface is formed on the substrate. In an alternative embodiment, the patterning surface 112 is featureless and the same size as the substrate and a planar surface is formed across the entire substrate.

Template 108 may be coupled to a template chuck 118. The template chuck 118 may be, but is not limited to, vacuum chuck, pin-type chuck, groove-type chuck, electrostatic chuck, electromagnetic chuck, and/or other similar chuck types. The template chuck 118 may be configured to apply stress, pressure, and/or strain to template 108 that varies across the template 108. The template chuck 118 may include piezoelectric actuators which can squeeze and/or stretch different portions of the template 108. The template chuck 118 may include a system such as a zone based vacuum chuck, an actuator array, a pressure bladder, etc. which can apply a pressure differential to a back surface of the template causing the template to bend and deform.

The template chuck 118 may be coupled to an imprint head 120 which is a part of the positioning system. The imprint head may be moveably coupled to a bridge. The imprint head 120 may include one or more actuators such as voice coil motors, piezoelectric motors, linear motor, nut and screw motor, etc., which are configured to move the template chuck 118 relative to the substrate in at least the z-axis direction, and potentially other directions (for example x, y, θ, ψ, and φ-axes).

The nanoimprint lithography system 100 may further comprise a fluid dispenser 122. The fluid dispenser 122 may also be moveably coupled to the bridge. In an embodiment, the fluid dispenser 122 and the imprint head 120 share one or more or all positioning components. In an alternative embodiment, the fluid dispenser 122 and the imprint head 120 move independently from each other. The fluid dispenser 122 may be used to deposit liquid formable material 124 (for example: a mixture that includes a polymerizable material; a liquid material that can be solidified or gelled by being exposed to actinic radiation) onto the substrate 102 in a pattern. Additional formable material 124 may also be added to the substrate 102 using techniques, such as, drop dispense, spin-coating, dip coating, chemical vapor deposition (CVD), physical vapor deposition (PVD), thin film deposition, thick film deposition, and/or the like prior to the formable material 124 being deposited onto the substrate 102. The formable material 124 may be dispensed upon the substrate 102 before and/or after a desired volume is defined between the mold 112 and the substrate 102 depending on design considerations. The formable material 124 may comprise a mixture including a monomer as described in U.S. Pat. Nos. 7,157,036 and 8,076,386, both of which are herein incorporated by reference.

Different fluid dispensers 122 may use different technologies to dispense formable material 124. When the formable material 124 is jettable, ink jet type dispensers may be used to dispense the formable material. For example, thermal ink jetting, microelectromechanical systems (MEMS) based ink jetting, valve jet, and piezoelectric ink jetting are common techniques for dispensing jettable liquids.

The nanoimprint lithography system 100 may further comprise a curing system that includes at least a radiation source 126 that directs actinic energy along an exposure path 128. The imprint head and the substrate positioning stage 106 may be configured to position the template 108 and the substrate 102 in superimposition with the exposure path 128. The radiation source 126 sends the actinic energy along the exposure path 128 after the template 108 has contacted the formable material 128. FIG. 1 illustrates the exposure path 128 when the template 108 is not in contact with the formable material 124, this is done for illustrative purposes so that the relative position of the individual components can be easily identified. An individual skilled in the art would understand that exposure path 128 would not substantially change when the template 108 is brought into contact with the formable material 124.

The nanoimprint lithography system 100 may further comprise a field camera 136 that is positioned to view the spread of formable material 124 after the template 108 has made contact with the formable material 124. FIG. 1 illustrates an optical axis of the field camera's imaging field as a dashed line. As illustrated in FIG. 1 the nanoimprint lithography system 100 may include one or more optical components (dichroic mirrors, beam combiners, prisms, lenses, mirrors, etc.) which combine the actinic radiation with light to be detected by the field camera. The field camera 136 may be configured to detect the spread of formable material under the template 108. The optical axis of the field camera 136 as illustrated in FIG. 1 is straight but may be bent by one or more optical components. The field camera 136 may include one or more of a CCD, a sensor array, a line camera, and a photodetector which are configured to gather light that has a wavelength that shows a contrast between regions underneath the template 108 that are in contact with the formable material, and regions underneath the template 108 which are not in contact with the formable material 124. The field camera 136 may be configured to gather monochromatic images of visible light. The field camera 136 may be configured to provide images of the spread of formable material 124 underneath the template 108; the separation of the template 108 from cured formable material; and can be used to keep track of the imprinting process. The field camera 136 may also be configured to measure interference fringes, which change as the formable material spreads 124 between the gap between the patterning surface 112 and the substrate surface 130.

The nanoimprint lithography system 100 may further comprise a droplet inspection system 138 that is separate from the field camera 136. The droplet inspection system 138 may include one or more of a CCD, a camera, a line camera, and a photodetector. The droplet inspection system 138 may include one or more optical components such as lenses, mirrors, apertures, filters, prisms, polarizers, windows, adaptive optics, and/or light sources. The droplet inspection system 138 may be positioned to inspect droplets prior to the patterning surface 112 contacting the formable material 124 on the substrate 102.

The nanoimprint lithography system 100 may further include a thermal radiation source 134 which may be configured to provide a spatial distribution of thermal radiation to one or both of the template 108 and the substrate 102. The thermal radiation source 134 may include one or more sources of thermal electromagnetic radiation that will heat up one or both of the substrate 102 and the template 108 and does not cause the formable material 124 to solidify. The thermal radiation source 134 may include a spatial light modulator such as a digital micromirror device (DMD), Liquid Crystal on Silicon (LCoS), Liquid Crystal Device (LCD), etc., to modulate the spatio-temporal distribution of thermal radiation. The nanoimprint lithography system may further comprise one or more optical components which are used to combine the actinic radiation, the thermal radiation, and the radiation gathered by the field camera 136 onto a single optical path that intersects with the imprint field when the template 108 comes into contact with the formable material 124 on the substrate 102. The thermal radiation source 134 may send the thermal radiation along a thermal radiation path (which in FIG. 1 is illustrated as 2 thick dark lines) after the template 108 has contacted the formable material 128. FIG. 1 illustrates the thermal radiation path when the template 108 is not in contact with the formable material 124, this is done for illustrative purposes so that the relative position of the individual components can be easily identified. An individual skilled in the art would understand that the thermal radiation path would not substantially change when the template 108 is brought into contact with the formable material 124. In FIG. 1 the thermal radiation path is shown terminating at the template 108, but it may also terminate at the substrate 102. In an alternative embodiment, the thermal radiation source 134 is underneath the substrate 102, and thermal radiation path is not combined with the actinic radiation and the visible light.

Prior to the formable material 124 being dispensed onto the substrate, a substrate coating 132 may be applied to the substrate 102. In an embodiment, the substrate coating 132 may be an adhesion layer. In an embodiment, the substrate coating 132 may be applied to the substrate 102 prior to the substrate being loaded onto the substrate chuck 104. In an alternative embodiment, the substrate coating 132 may be applied to substrate 102 while the substrate 102 is on the substrate chuck 104. In an embodiment, the substrate coating 132 may be applied by spin coating, dip coating, etc. In an embodiment, the substrate 102 may be a semiconductor wafer. In another embodiment, the substrate 102 may be a blank template (replica blank) that may be used to create a daughter template after being imprinted.

The nanoimprint lithography system 100 may include an imprint field atmosphere control system such as gas and/or vacuum system, an example of which is described in U.S. Patent Publication Nos. 2010/0096764 and 2019/0101823 which are hereby incorporated by reference. The gas and/or vacuum system may include one or more of pumps, valves, solenoids, gas sources, gas tubing, etc. which are configured to cause one or more different gases to flow at different times and different regions. The gas and/or vacuum system 36 may be connected to a first gas transport system that transports gas to and from the edge of the substrate 102 and controls the imprint field atmosphere by controlling the flow of gas at the edge of the substrate 102. The gas and/or vacuum system may be connected to a second gas transport system that transports gas to and from the edge of the template 108 and controls the imprint field atmosphere by controlling the flow of gas at the edge of the template 108. The gas and/or vacuum system may be connected to a third gas transport system that transports gas to and from the top of the template 108 and controls the imprint field atmosphere by controlling the flow of gas through the template 108. One or more of the first, second, and third gas transport systems may be used in combination or separately to control the flow of gas in and around the imprint field.

The nanoimprint lithography system 100 may be regulated, controlled, and/or directed by one or more processors 140 (controller) in communication with one or more components and/or subsystems such as the substrate chuck 104, the substrate positioning stage 106, the template chuck 118, the imprint head 120, the fluid dispenser 122, the radiation source 126, the thermal radiation source 134, the field camera 136, imprint field atmosphere control system, and/or the droplet inspection system 138. The processor 140 may operate based on instructions in a computer readable program stored in a non-transitory computer readable memory 142. The processor 140 may be or include one or more of a CPU, MPU, GPU, ASIC, FPGA, DSP, and a general-purpose computer. The processor 140 may be a purpose-built controller or may be a general-purpose computing device that is adapted to be a controller. Examples of a non-transitory computer readable memory include but are not limited to RAM, ROM, CD, DVD, Blu-Ray, hard drive, networked attached storage (NAS), an intranet connected non-transitory computer readable storage device, and an internet connected non-transitory computer readable storage device.

Either the imprint head 120, the substrate positioning stage 106, or both varies a distance between the mold 110 and the substrate 102 to define a desired space (a bounded physical extent in three dimensions) that is filled with the formable material 124. For example, the imprint head 120 may apply a force to the template 108 such that mold 110 is in contact with the formable material 124. After the desired volume is filled with the formable material 124, the radiation source 126 produces actinic radiation (for example, UV, 248 nm, 280 nm, 350 nm, 365 nm, 395 nm, 400 nm, 405 nm, 435 nm, etc.) causing formable material 124 to cure, solidify, and/or cross-link; conforming to a shape of the substrate surface 130 and the patterning surface 112, defining a patterned layer on the substrate 102. The formable material 124 is cured while the template 108 is in contact with formable material 124, forming the patterned layer on the substrate 102. Thus, the nanoimprint lithography system 100 uses an imprinting process to form the patterned layer which has recesses and protrusions which are an inverse of the pattern in the patterning surface 112. In an alternative embodiment, the nanoimprint lithography system 100 uses an imprinting process to form a planar layer with a featureless patterning surface 112.

The imprinting process may be done repeatedly in a plurality of imprint fields (also known as just fields or shots) that are spread across the substrate surface 130. Each of the imprint fields may be the same size as the mesa 110 or just the pattern area of the mesa 110. The pattern area of the mesa 110 is a region of the patterning surface 112 which is used to imprint patterns on a substrate 102 which are features of the device or are then used in subsequent processes to form features of the device. The pattern area of the mesa 110 may or may not include mass velocity variation features (fluid control features) which are used to prevent extrusions from forming on imprint field edges. In an alternative embodiment, the substrate 102 has only one imprint field which is the same size as the substrate 102 or the area of the substrate 102 which is to be patterned with the mesa 110. In an alternative embodiment, the imprint fields overlap. Some of the imprint fields may be partial imprint fields which intersect with a boundary of the substrate 102.

The patterned layer may be formed such that it has a residual layer having a residual layer thickness (RLT) that is a minimum thickness of formable material 124 between the substrate surface 130 and the patterning surface 112 in each imprint field. The patterned layer may also include one or more features such as protrusions which extend above the residual layer having a thickness. These protrusions match the recesses 114 in the mesa 110.

Template

FIG. 2 is an illustration of a template 108 that may be used in an embodiment. The patterning surface 112 may be on a mesa 110 (identified by the dashed box in FIG. 2). The mesa 110 is surrounded by a recessed surface 244 on the front side of the template. Mesa sidewalls 246 connect the recessed surface 244 to patterning surface 112 of the mesa 110 along mesa edges 210e. The mesa sidewalls 246 surround the mesa 110. In an embodiment in which the mesa is round or has rounded corners, the mesa sidewalls 246 refers to a single mesa sidewall that is a continuous wall without corners.

Imprinting Process

FIG. 3 is a flowchart of a method of manufacturing an article (device) that includes an imprinting process 300 by the nanoimprint lithography system 100 that can be used to form patterns in formable material 124 on one or more imprint fields (also referred to as: pattern areas or shot areas). The imprinting process 300 may be performed repeatedly on a plurality of substrates 102 by the nanoimprint lithography system 100. The processor 140 may be used to control the imprinting process 300.

In an alternative embodiment, the imprinting process 300 is used to planarize the substrate 102. In which case, the patterning surface 112 is featureless and may also be the same size or larger than the substrate 102.

The beginning of the imprinting process 300 may include a template mounting step causing a template conveyance mechanism to mount a template 108 onto the template chuck 118. The imprinting process may also include a substrate mounting step, the processor 140 may cause a substrate conveyance mechanism to mount the substrate 102 onto the substrate chuck 104. The substrate may have one or more coatings and/or structures. The order in which the template 108 and the substrate 102 are mounted onto the nanoimprint lithography system 100 is not particularly limited, and the template 108 and the substrate 102 may be mounted sequentially or simultaneously.

In a positioning step, the processor 140 may cause one or both of the substrate positioning stage 106 and/or a dispenser positioning stage to move an imprinting field i (index i may be initially set to 1) of the substrate 102 to a fluid dispense position below the fluid dispenser 122. The substrate 102, may be divided into N imprinting fields, wherein each imprinting field is identified by an index i. In which N is a real integer such as 1, 10, 75, etc. $\{N \in \mathbb{Z}^{\pm}\}$. In a dispensing step S302, the processor 140 may cause the fluid dispenser 122 to dispense formable material onto an imprinting field i. In an embodiment, the fluid dispenser 122 dispenses the formable material 124 as a plurality of droplets. The fluid dispenser 122 may include one nozzle or multiple nozzles. The fluid dispenser 122 may eject formable material 124 from the one or more nozzles simultaneously. The imprint field i may be moved relative to the fluid dispenser 122 while the fluid dispenser is ejecting formable material 124. Thus, the time at which some of the droplets land on the substrate may vary across the imprint field i. In an embodiment, during the dispensing step S302, the formable material 124 may be dispensed onto a substrate in accordance with a drop pattern. The drop pattern may include information such as one or more of position to deposit drops of formable material, the volume of the drops of formable material, type of formable material, shape parameters of the drops of formable material, etc. In an embodiment, the drop pattern may include only the volumes of the drops to be dispensed and the location of where to deposit the droplets.

After, the droplets are dispensed, then a contacting step S304 may be initiated, the processor 140 may cause one or both of the substrate positioning stage 106 and a template positioning stage to bring the patterning surface 112 of the template 108 into contact with the formable material 124 in imprint field i.

During a spreading step S306, the formable material 124 then spreads out towards the edge of the imprint field i and the mesa sidewalls 246. The edge of the imprint field may be defined by the mesa sidewalls 246. How the formable material 124 spreads and fills the mesa can be observed via the field camera 136 and may be used to track a progress of a fluid front of formable material.

In a curing step S308, the processor 140 may send instructions to the radiation source 126 to send a curing illumination pattern of actinic radiation through the template 108, the mesa 110 and the patterning surface 112. The curing illumination pattern provides enough energy to cure (polymerize) the formable material 124 under the patterning surface 112.

In a separation step S310, the processor 140 uses one or more of the substrate chuck 104, the substrate positioning stage 106, template chuck 118, and the imprint head 120 to separate the patterning surface 112 of the template 108 from the cured formable material on the substrate 102. If there are additional imprint fields to be imprinted, then the process moves back to step S302.

In an embodiment, after the imprinting process 300 is finished additional semiconductor manufacturing processing is performed on the substrate 102 in a processing step S312 so as to create an article of manufacture (for example a semiconductor device). In an embodiment, each imprint field includes a plurality of devices.

The further semiconductor manufacturing processing in processing step S312 may include etching processes to transfer a relief image into the substrate that corresponds to the pattern in the patterned layer or an inverse of that pattern. The further processing in processing step S312 may also include known steps and processes for article fabrication, including, for example, inspection, curing, oxidation, layer formation, deposition, doping, planarization, etching, formable material removal, dicing, bonding, packaging, and the like. The substrate 102 may be processed to produce a plurality of articles (devices).

Imprinting System with a Spatial Light Modulator

Figure 4A:
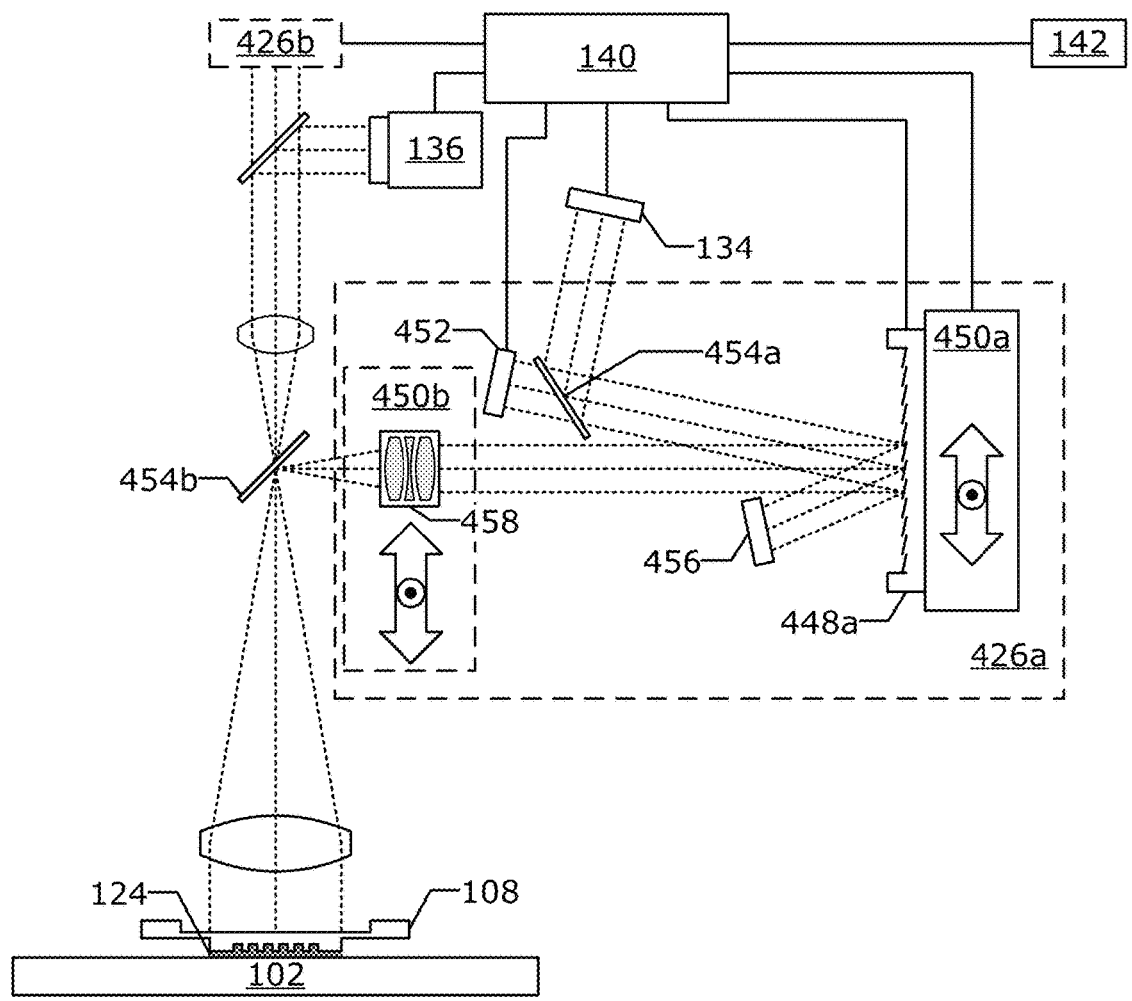
FIG. 4A is an illustration of particular components of an exemplary imprinting system as used in embodiments.

FIG. 4A is an illustration of a nanoimprint lithography system 400a that is substantially similar to the nanoimprint lithography system 100 illustrated in FIG. 1 in which a spatial light modulator (SLM) 448 is explicitly shown as a DMD 448a. In an embodiment, the spatial light modulator 448 may be attached to a 2D motion stage 450a. In an alternative embodiment, a 2D motion stage 450b is attached to one or more lenses positioned in an optical path from the spatial light modulator 448 to the shaping surface 112. The 2D motion stage 450 moves in two orthogonal directions that are also orthogonal to the direction of a beam exiting the SLM 448. The order, arrangement, and use of optical components such as light sources, beam splitters, lenses, and mirrors as illustrated in FIG. 4A are exemplary and other arrangements of optical components can be used to carry out an embodiment.

The nanoimprint lithography system 400a may include a first source of actinic radiation 426a. The first source of actinic radiation 426a may include an actinic illumination device 452 such as a laser, LED, or a lamp. The actinic illumination device 452 is positioned to illuminate the spatial light modulator 448 such as a DMD 448a in FIG. 4A. One or more optical components may be arranged to guide the actinic radiation to the spatial light modulator. The first source of actinic radiation 426a may receive one or more signals from the processor 140 with instructions on when and how much actinic radiation to provide.

The spatial light modulator 448 may be a digital micromirror device (DMD), Liquid Crystal on Silicon (LCoS), Liquid Crystal Device (LCD), spatial light valve, mirror array, MOEMS, diffractive MEMS, etc., to modulate the spatio-temporal distribution of actinic radiation from the first actinic radiation source 426a. The spatial light modulator 448a may also be configured to irradiate one or more of the substrate 102, the template 108, and/or the formable material 124 with radiation from a thermal radiation source 134. A beam combiner 454a may be used to combine actinic radiation the actinic illumination device 452 and the thermal radiation source 134. One or more optical components 458 may be used to guide radiation from the spatial light modulator to formable material 124 under the template 108.

The spatial light modulator 448 may include a plurality of pixels tessellated across the spatial light modulator 448. Each pixel may be individually addressable in both space and time. The processor 140 may be configured to send a first set of signals to the spatial light modulator 448 based on a map of modulation values received from the memory 142. In response to the first set of signals the spatial light modulator 448 will change the state of individual pixels in the spatial light modulator. In an embodiment, the map is information indicating on/off status of each pixel of the spatial light modulator 448 (DMD, LCD). In an embodiment, the map is information indicating the status of each pixel of the spatial light modulator 448 (DMD, LCD). In which the status includes one or more of: on/off status; on/off status duration; amount reflected (for reflective LCD); amount transmitted (for transmitted LCD).

In the case in which the spatial light modulator is a DMD 448*a* changing the state of a pixel means moving a micromirror from a first angle to a second angle. In the case in which the spatial light modulator 448 is a transmissive spatial light modulator, such as an LCD or a spatial light valve, changing the state of a pixel means changing the transmissivity of the pixel. Changing the transmissivity may include changing the state of a polarization retarder (for example a liquid crystal). The polarization retarder may include or be optically coupled to a polarizer which blocks some portion of the light. In the case in which the spatial light modulator 448 is a reflective spatial light modulator, such as an LCoS, changing the state of a pixel means changing the reflectivity of the pixel. Changing the reflectivity may include changing the state of a polarization retarder (for example a liquid crystal) on a reflective surface. The polarization retarder may include or be optically coupled to a polarizer which blocks some portion of the light.

FIG. 4A is an illustration of an embodiment 400*a* in which the spatial light modulator is a DMD 448*a*. Individual mirrors (pixels) on the spatial light modulator may be in a first state that guides the actinic radiation towards the template or in a second state that guides the actinic radiation away from the template for example towards a beam dump 456.

Figure 4B:
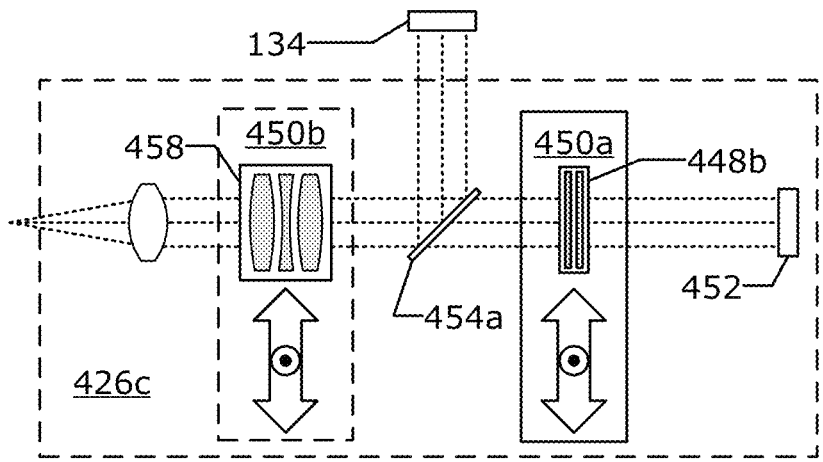
FIGS. 4B-D are illustrations of alternative sources of actinic radiation as used in embodiments.

FIG. 4B is an illustration of an embodiment 400*b* with a second alternative first source of actinic radiation 426*c* in which the spatial light modulator is a transmissive spatial light modulator 448*b* such as an LCD. The transmissive spatial light modulator 448*b* may include a spatio-temporally addressable liquid crystal polarization retarder and a polarizer. The transmissive spatial light modulator 448*b* may include MEMS based spatio-temporally addressable light valves.

Figure 4C:
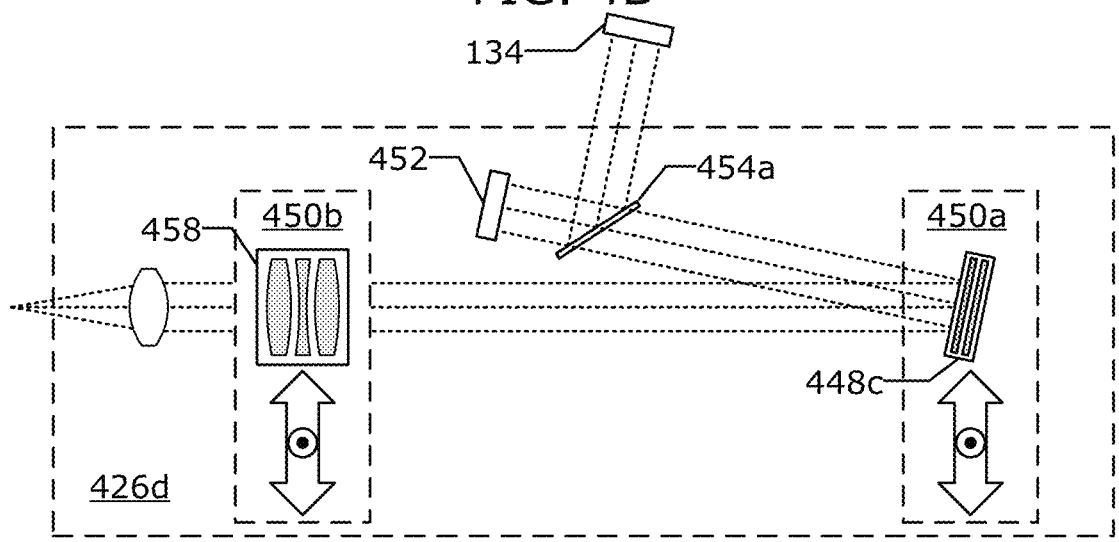

FIG. 4C is an illustration of an embodiment 400*c* with a second alternative second source of actinic radiation 426*d* in which the spatial light modulator is a reflective spatial intensity modulator 448*c* such as a LCoS device. The reflective spatial light modulator 448*c* may include a spatio-temporally addressable liquid crystal polarization retarder, a polarizer, and a reflective surface such as silicon. The reflective spatial intensity modulator 448*c* may include a MEMS based spatio-temporally addressable reflective surface.

The spatial light modulator 448 is positioned to illuminate the formable material 124 under the template 108 with actinic radiation (also spatio-temporal distribution of energy (J/m$^2$) in accordance with signals received from the processor 140 which are representative of a map of modulation values (for example intensity and/or duty cycles). The actinic radiation cures or helps cure the formable material 124 under the template 108. An embodiment may include one or more optical components such as lenses, mirror, apertures, etc. which guide the radiation from the spatial light modulator 448 to the formable material 124. An embodiment may include one or more optical components which help match the shape of the active area of the spatial light modulator 448 to the shape of the mesa 110. An embodiment may include one or more optical components which adjust the position of the focal plane of the actinic radiation from the spatial light modulator relative to formable material 124.

Figure 4D:
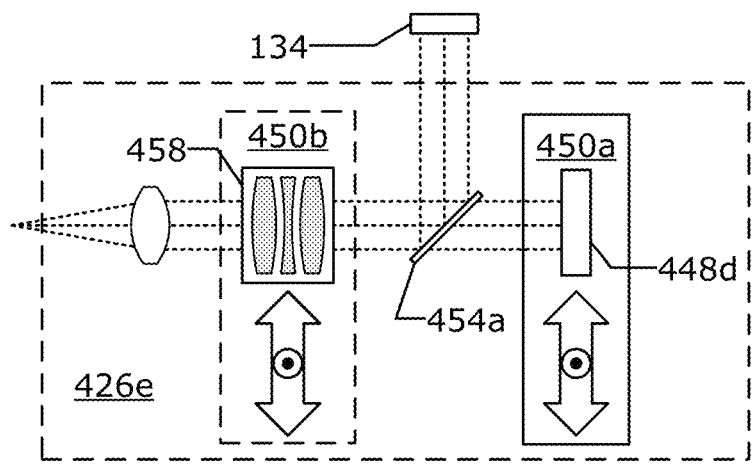

FIG. 4D is an illustration of an embodiment 400*d* with a fourth alternative first source of actinic radiation 426*e* that does not include an actinic illumination device 452 that is modulated by a spatial light modulator, instead the spatial light modulator 448*d* is an array of actinic radiation sources, for example an LED array. In which each element in the array of actinic radiation sources is addressable. Each element in the in the array of actinic radiation sources may be a laser, LED, or a lamp.

An embodiment, may include a second source of actinic radiation source 426*b* which has not been guided by the spatial light modulator to the plane of the formable material 124. Actinic radiation from the second source actinic radiation source 426*b* is guided by one or more other optical components to the formable material 124. The second source of actinic radiation source 426*b* may have the same or different wavelength from the first actinic radiation source 426*a*. An embodiment may include one or more beam combiners 454*b* (such as prisms, half silvered mirrors, dichroic filters, etc.) which combine light from the spatial light modulator 448 and the second source of actinic radiation 426*b*. In an embodiment, actinic radiation from each of the radiation sources may be directed at the formable material 124 from a different angle.

In an embodiment, the second source of actinic radiation 426*b* is configured to illuminate a central portion of the patterning surface 112 and the first source of actinic radiation 426*a* is configured illuminate the outer edges of the patterning surface 112 near the mesa sidewalls 246.

An embodiment, may include a field camera 136 which monitors the formable material under the template 108 and may control the timing of the illumination of the formable material 124 with actinic radiation.

In an embodiment, the fill factor of the spatial light modulator 448 is less than 100%. The fill factor varies depending on the technologies, from a high of 94% (or potentially more in the future) down to less than 1% depending on the modulation technology. Artifacts can be formed in the cured formable material due to the less than 100% fill factor.

Figure 5A:
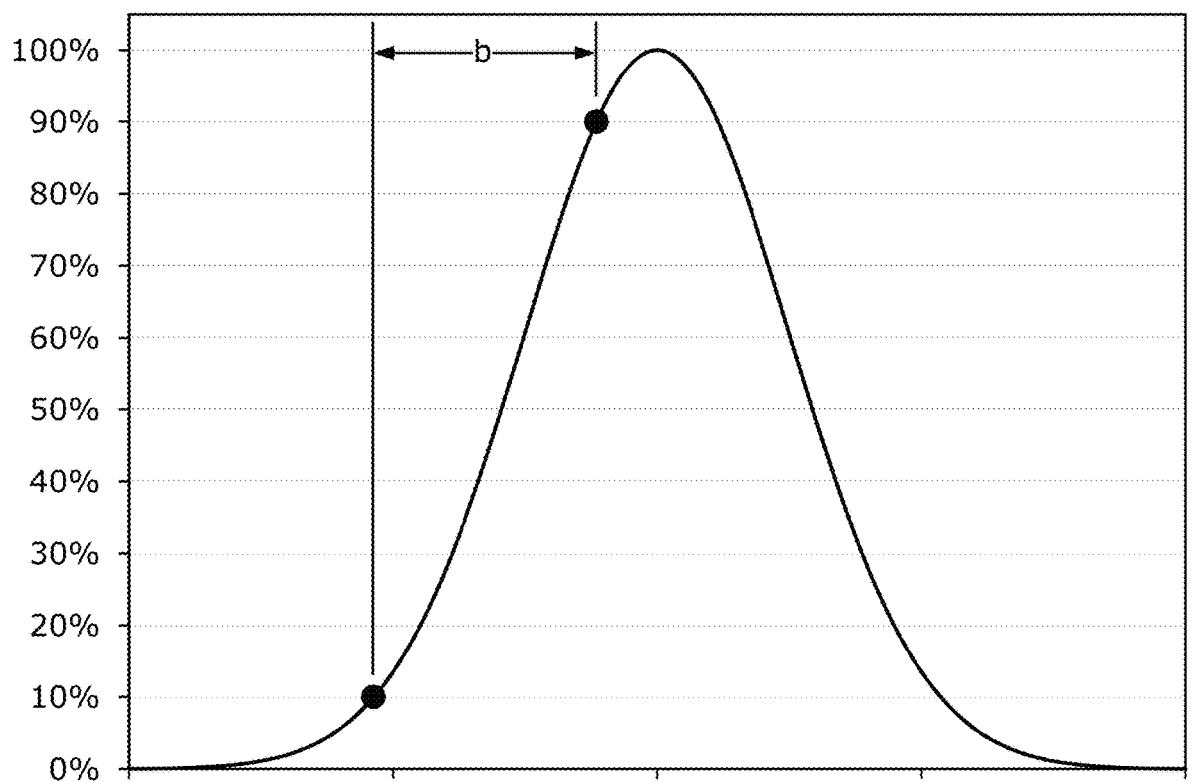
FIG. 5A is an illustration of a cross section of a gaussian beam as might be used in an embodiment.

To achieve a precise curing along the imprint field edge, high-resolution position control of a beam of actinic radiation supplied to the shaping surface is desired along the edge of the mesa. A projection system that focuses actinic radiation at the shaping surface enables precise position control of the dosage of actinic radiation at the edge of the mesa. For example, if a single modulation element is perfectly focused onto the shaping surface, the edge of the dosage profile will have a sharp edge and a blur width of zero or within the measurement error. The projection system is never perfect, so the sharpness of the edge is limited by the blur width b. The blur width b may also be limited by the fundamental physics of the optical system. The blur width b can be measured by measuring the intensity, or dosage of the actinic radiation along a sharp edge. FIG. 5A is an illustration of an intensity cross section of a gaussian beam. The blur width b is a distance between 90% measurement and 10% measurement of the peak intensity as shown in FIG. 5A. For a gaussian beam this is approximately 1.7 times the standard deviation of the gaussian beam. The better the focus the smaller the blur width b. Reduced blur from focused light allows for a beam to be placed closer to the mesa edge 210*e* to ensure adequate curing of the resist pattern while minimizing the dose received by a potential extrusion. However, a highly focused projection leads to intensity (& subsequently dosage) non-uniformity in the interior of the field-low intensity zones in the interstitials between the pixels. This affects the curing quality in the interior of the field and further affects the characterization capability using certain metrology tools-such as KLA defect analyzer.

Figure 5B:
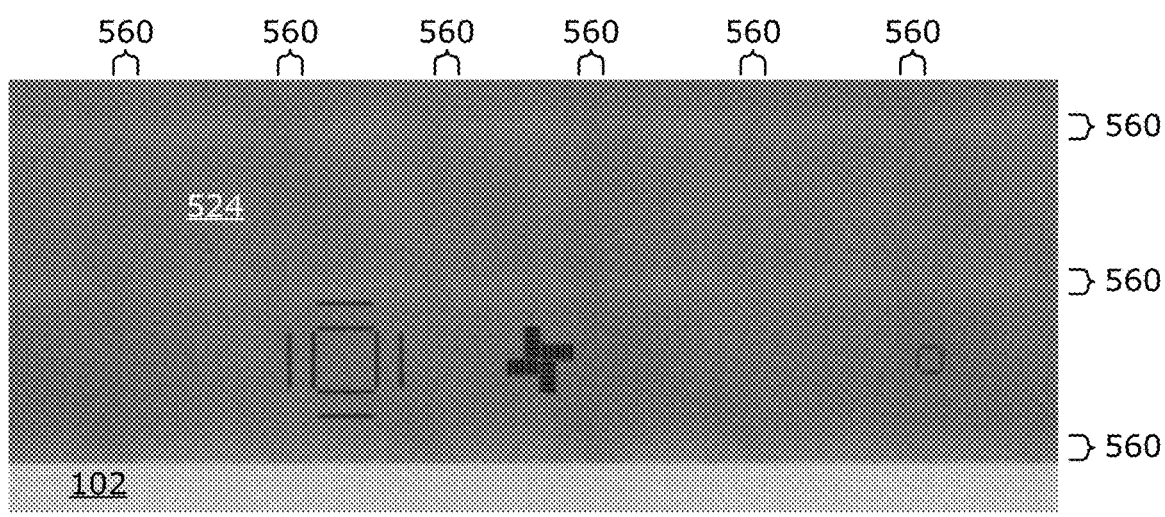
FIG. 5B is a micrograph of a cured film.

FIG. 5B is a micrograph of a cured film 524 on a substrate 102. The cured film 524 includes three features shown as black areas of the micrograph. The cured film 524 includes undercured regions in interstitial areas 560. These undercured regions can impact the ability to inspect and identify defects. Sometimes these undercured regions can also impact the ability to transfer patterns into the substrate in subsequent processing steps S312.

Figure 5C:
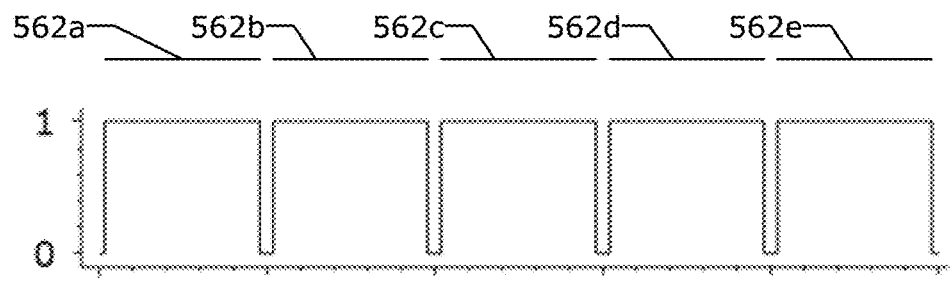
FIG. 5C is an illustration of active area of a pixel as might be used in an exemplary embodiment.
Figure 5D:
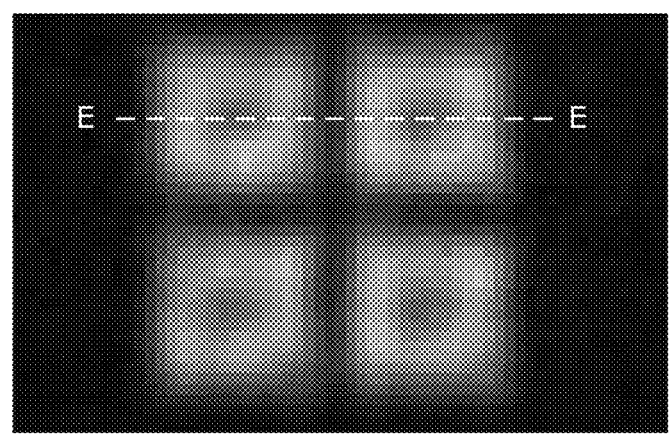
FIGS. 5D-E are illustrations of an intensity measurements as produced by modulation elements of an exemplary embodiment.
Figure 5E:
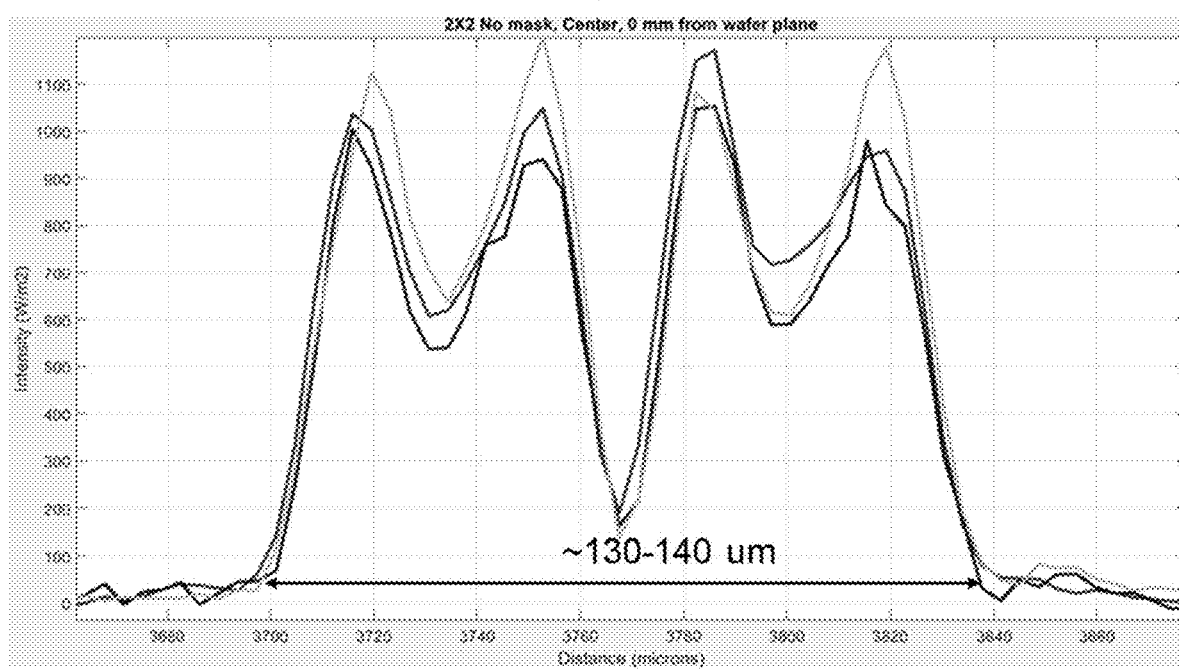

FIG. 5C is an illustration of the active areas of 5 exemplary pixels (562a, 562b, 562c, 562d, and 562e) in a spatial light modulator with a 92% fill factor. Between each modulation element 562 is an interstitial region of the SLM which produces the undercured interstitial areas 560 on the cured film 524. FIG. 5D is an illustration of an intensity measurement at the plane of the substrate associated with four modulation elements 562 of the spatial light modulator. FIG. 5E are intensity profiles along lines E-E and of the intensity measurement shown in FIG. 5D.

In an embodiment, each pixel may produce a substantially symmetric or substantially radially symmetric actinic radiation intensity spatial distribution that overlaps with those neighboring pixels. Thus, the effective intensity at any location on the formable material, is not just the intensity of the radiation from the corresponding individual pixel but a cumulative sum of contributions from neighboring pixels as well. The applicant has found that there is a need to intelligently select the pixels & their intensity (changing duty cycle) on the SLM such that the effective irradiation dose (intensity integrated over an exposure time) at any particular location can be controlled precisely and dimensional control of the curing can be significantly improved.

Method for Generating a Set of Illumination Patterns

Figure 6A:
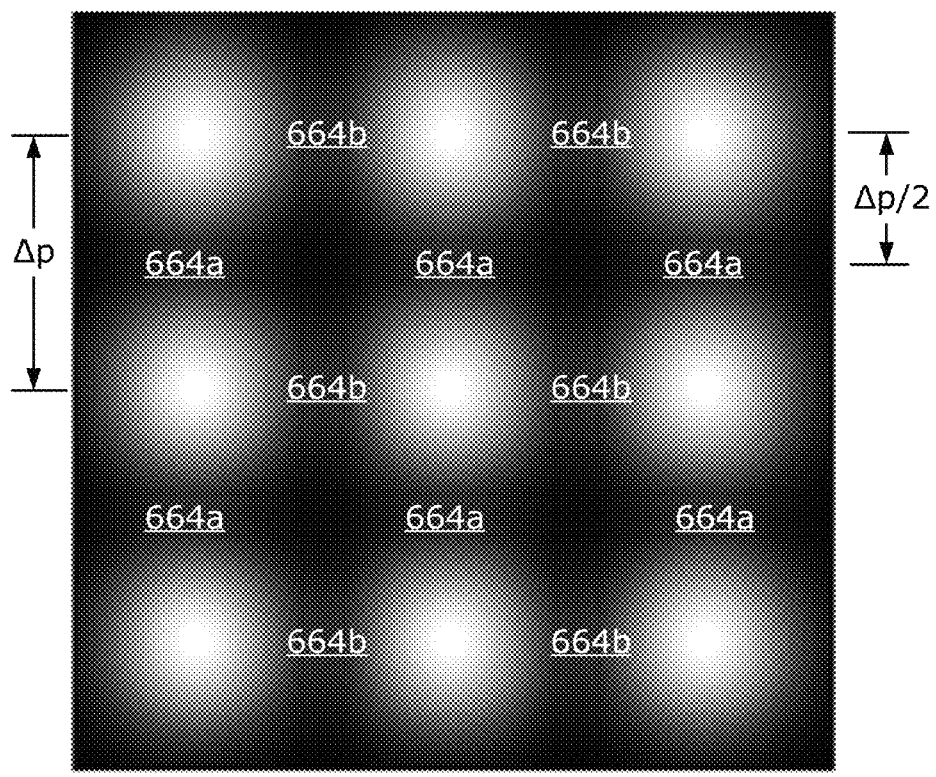
FIGS. 6A-L are illustrations of simulated intensity patterns as used in an embodiment.

The applicant has developed a shaping process that reduces the impact of the interstitial regions of the SLM on the cured film 524. This process make use of an SLM 448 and a 2D motion stage 450. FIG. 6A is a simplified simulated intensity map of actinic radiation on the substrate plane produced by a 3×3 array of modulation elements with a pixel pitch $\Delta p$ and a half pixel pitch of $\Delta p/2$. In this simulated example, the SLM 448 produces 3×3 array of gaussian beamlets. The pixel to pixel pitch is 70 μm and standard deviation of the gaussian beam size is set at 17 μm. The simulation parameters may vary depending on the shaping system 100 and can be determined based on experimental studies, by curing formable material using the SLM 448, and/or using beam profiler such as a CCD or CMOS camera to measure light from the SLM 448 at the plane of the formable material. The applicant has found that an ideal gaussian distribution of the actinic radiation is a reasonable approximation of the actinic radiation supplied by individual beamlets from the SLM 448.

Figure 6B:
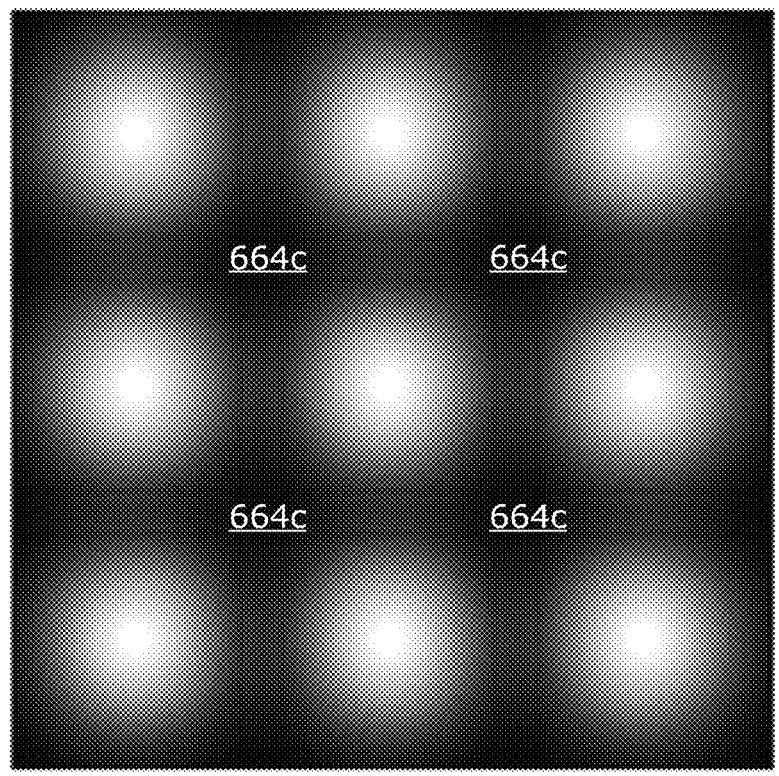

Between each of the pixels there are interstitial regions 664, these interstitial regions may be divided into categories: a first subset of first order interstitials 664a; a second subset of first order interstitials 664b; and second order interstitials 664c. The first and second subsets of first order interstitials 664a-b are between two adjacent pixels as illustrated in FIG. 6A. The first subset of first order interstitials 664a are between two adjacent pixels along a first axis such as the x-axis as illustrated in FIG. 6A. The second subset of first order interstitials 66ba are between two adjacent pixels along a second axis orthogonal to the first axis such as the y-axis as illustrated in FIG. 6A. The first order interstitials 664a-b may also be between a pixel & boundary/edge of the curing region. The second order interstitials 664c are between four adjoining pixels as illustrated in FIG. 6B. For the example illustrated in FIGS. 6A-C, there are: 6 first portion of first order interstitials 664a; 6 second portion of first order interstitials 664b; and 4 second order interstitials 664c. Generally for an m (rows)×n (columns) pixel pattern/map, there will be (m*(n−1)+(m−1)*n) first order interstitials 664a-b and (m−1)*(n−1) second order interstitial 664c.

Figure 6C:
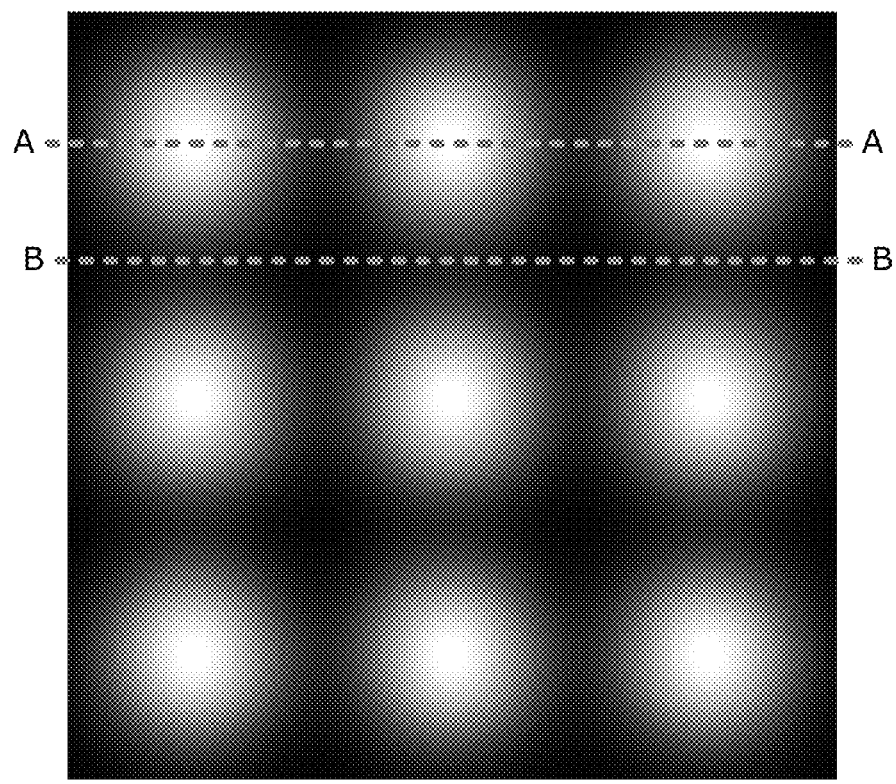
Figure 6D:
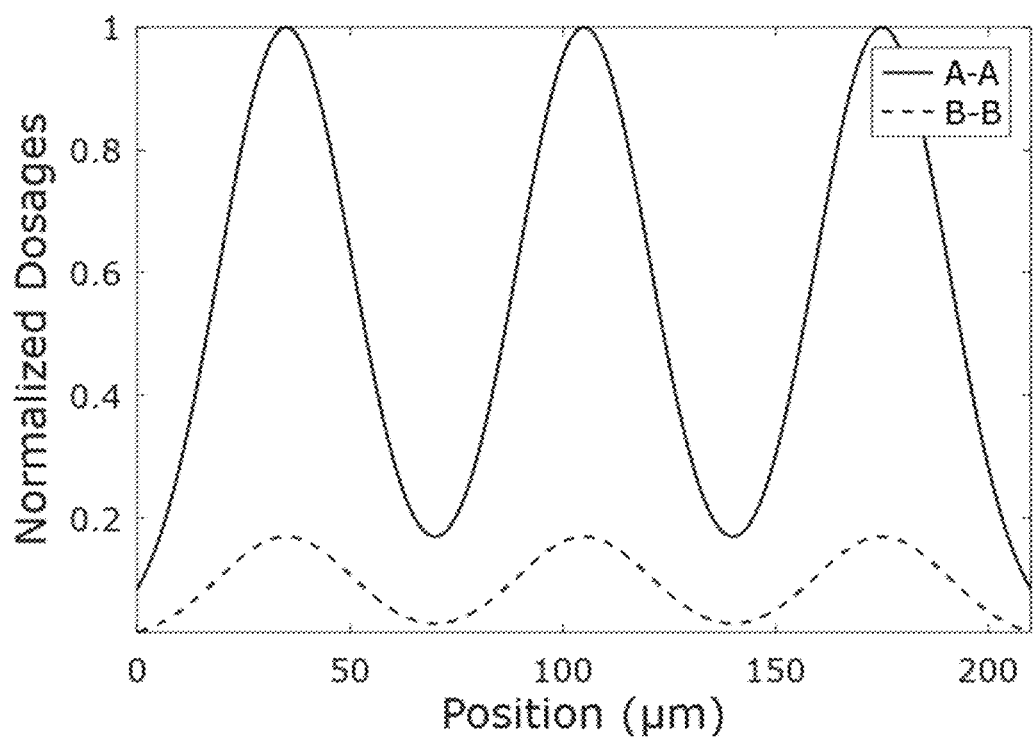

FIG. 6D is an illustration of the normalized intensity cross-section across lines A-A and B-B shown in FIG. 6C. As shown in FIG. 6D the intensities in the interstitials can go down significantly below 20% of the highest intensity in the center of projected images of the pixels. Such large intensity variations may lead to problems in curing and inspection. To overcome this issue the applicant uses a method that includes actuating a 2D motion stage 450 that translates the SLM 448 (or an optical element in the optical between the SLM 448 and the shaping surface 112) while also using a set of SLM patterns with different duty cycles designed to minimize these interstitial intensity differences and achieve a more uniform curing of the formable material 124. In an embodiment, the 2D motion stage 450 can be moved in two directions in a plane orthogonal to propagation direction of light exiting the SLM 448. The 2D motion stage 450 may include two of: a piezo-actuated stage; a linear motion stage; a brushless DC motor stage; a DC motor stage; a stepper motor; or some other motion actuator. The motion resolution of 2D motion stage 450 is less than the pitch of the pixels 562 of the SLM 448. In an embodiment, the motion resolution of the 2D motion is less than a half pixel pitch ($\Delta p/2$). In an embodiment, the motion resolution of the 2D motion is less than a fifth of a pixel pitch ($\Delta p/5$).

Figure 6E:
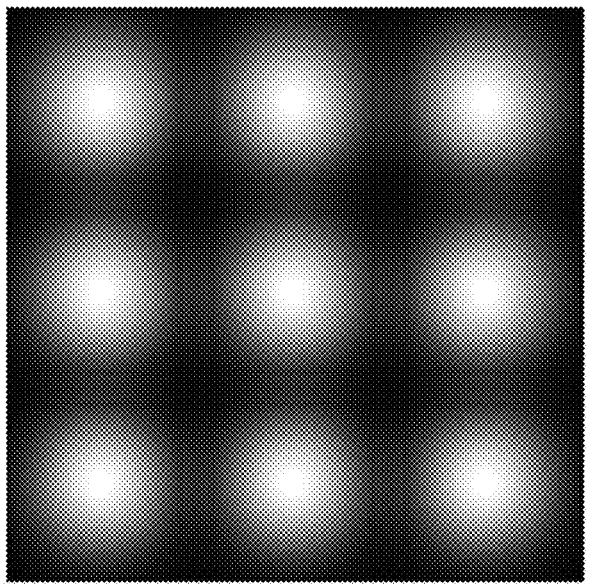

FIGS. 6E-6H are illustrations of predicted dosage patterns at the plane of the formable material associated with a four different modulation maps with four different positional shifts that might be used in an embodiment. FIG. 6E is an illustration of a base pattern $I_0(X, Y)$. This base pattern $I_0(X, Y)$ may cover a specific region of the imprint field for example may be frame shaped with the outer edge of the frame aligned with the edge of the imprint field. This might be a m×n sized pattern. For illustration purposes m=n=3. In an embodiment, m and n are on the order of the modulation elements in the SLM which may be on the order of m=800 and n=1000.

Figure 6F:
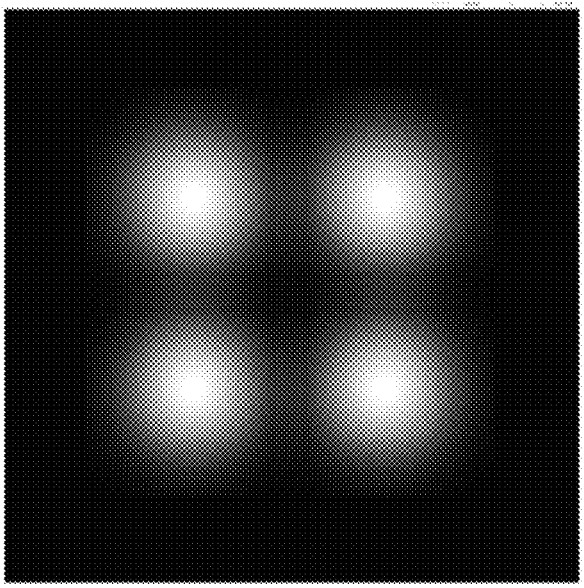

FIG. 6F is an illustration of a second order interstitial filling dosage pattern $I_2(X, Y)$. The $I_2(X, Y)$ dosage pattern is designed to fill the second order interstitials 664c in the desired curing region. The $I_2(X, Y)$ dosage pattern requires a positional shift in both X and Y directions by a half pixel pitch ($\Delta p/2$) such that the SLM pixels are centered around the second order interstitials 664c of the base pattern $I_0(X, Y)$. Size of the $I_2(X, Y)$ dosage pattern may be a (m−1)×(n−1) pattern.

Figure 6G:
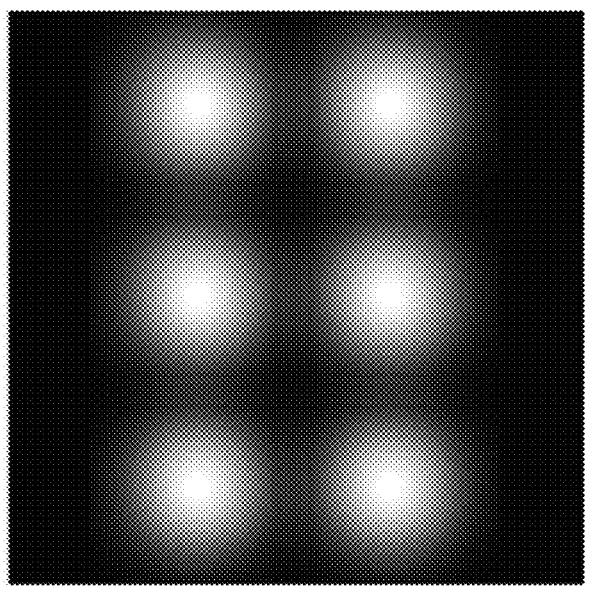

FIG. 6G is an illustration of a first order X-oriented interstitial filling dosage pattern $I_{1x}(X, Y)$. The $I_{1x}(X, Y)$ dosage pattern is designed to fill the first subset of first order interstitials 664b in the desired curing region. The $I_{1x}(X, Y)$ dosage pattern requires a positional shift in the Y direction by a half pixel pitch ($\Delta p/2$) such that the SLM pixels are centered around the first subset of first order interstitials 664b of the base pattern $I_0(X, Y)$. Size of the $I_{1x}(X, Y)$ dosage pattern may be a (m−1)×(n) pattern.

Figure 6H:
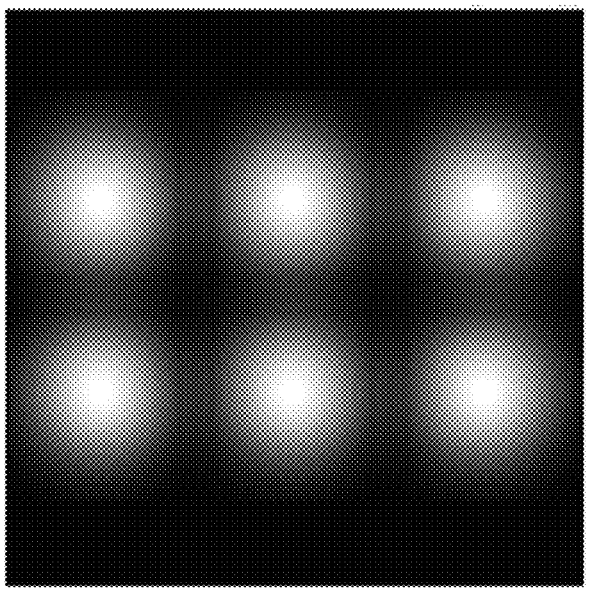

FIG. 6H is an illustration of a first order Y-oriented interstitial filling dosage pattern $I_{1y}(X, Y)$. The $I_{1y}(X, Y)$ dosage pattern is designed to fill the second subset of first order interstitials 664a in the desired curing region. The $I_{1y}(X, Y)$ dosage pattern requires a positional shift in the X direction by a half pixel pitch ($\Delta p/2$) such that the SLM pixels are centered around the second subset of first order interstitials 664a of the base pattern $I_0(X, Y)$. Size of the $I_{1y}(X, Y)$ dosage pattern may be a $(m) \times (n-1)$ pattern.

Figure 6I:
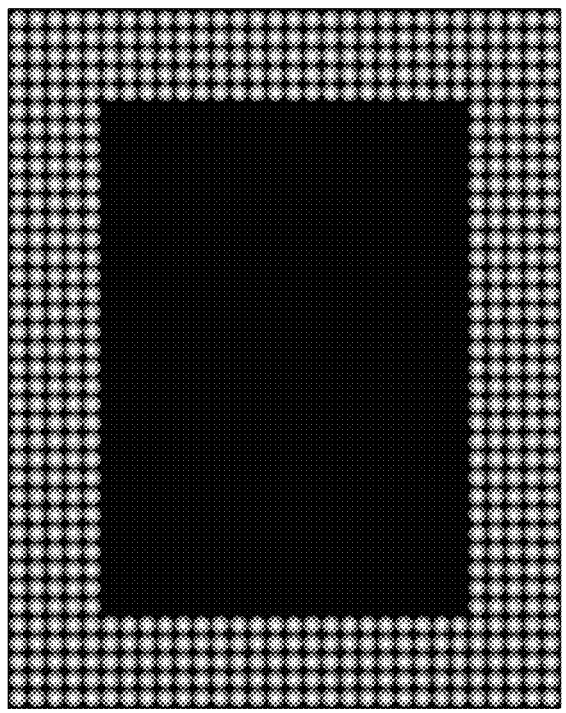
Figure 6J:
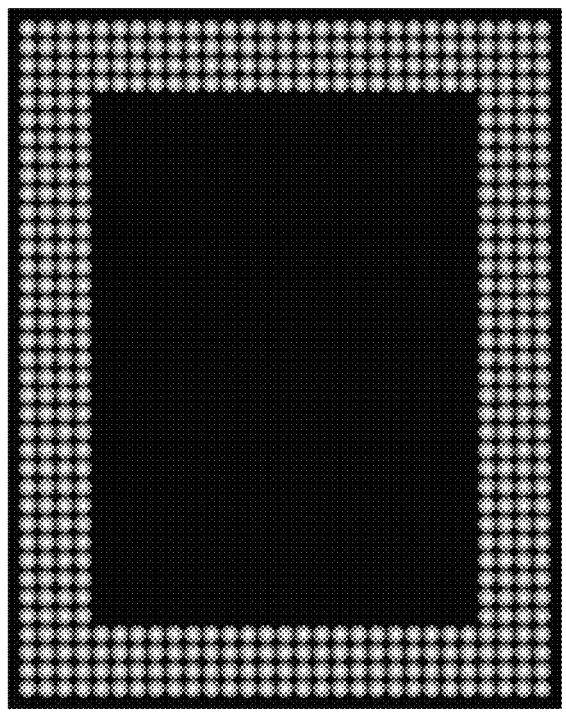
Figure 6K:
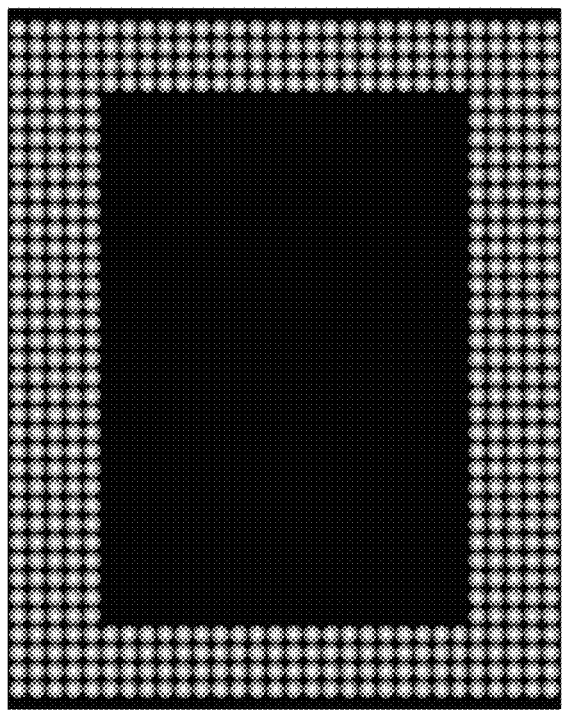
Figure 6L:
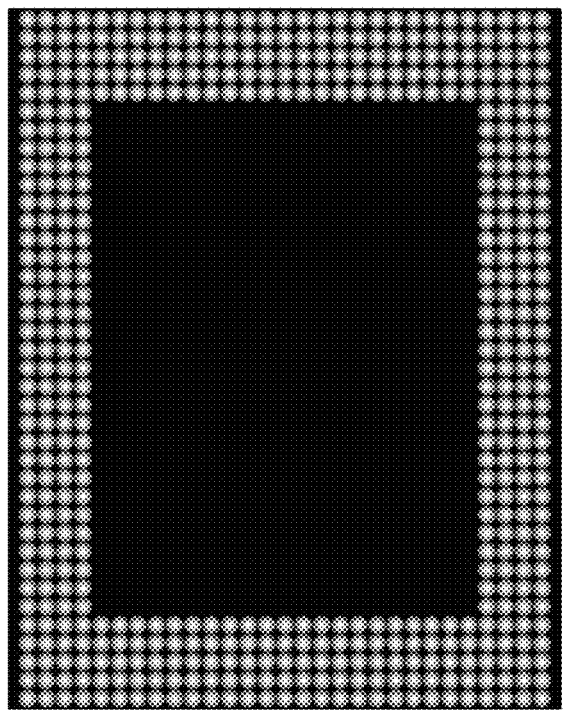

FIGS. 6I-L: are illustrations of predicted dosage patterns at the plane of the formable material associated with a four different modulation maps with four different positional shifts that might be used in an embodiment to produce a frame cure dosage distribution. FIG. 6I is an illustration of a frame shaped base pattern $I_0(X,Y)$. FIG. 6J is an illustration of a frame shaped second order interstitial filling dosage pattern $I_2(X,Y)$. Note that a base frame width $w_0$ on all four sides of the frame shaped base pattern $I_0(X,Y)$ illustrated in FIG. 6I is 5 pixels and the second order frame width $w_2$ of the frame shaped second order interstitial filling dosage pattern $I_2(X,Y)$ is four pixels. In general, the second order frame width $w_2$ is one less than the base frame width ($w_2=w_0-1$). FIG. 6K is an illustration of a frame shaped first order x-oriented interstitial filling dosage pattern $I_{1x}(X,Y)$. Note that the frame shaped first order x-oriented interstitial filling dosage pattern $I_{1x}(X,Y)$ illustrated in FIG. 6K has two different frame widths: a horizontal first order x-oriented frame width $w_{1xh}$ that is four pixels wide along the top and bottom edges; and a vertical first order x-oriented frame width $w_{1xv}$ that is five pixels wide the right and left edges. In general, the vertical first order x-oriented frame width wixv is equal to the base frame width $w_0$ ($w_{1xv}=w_0$). In general, the horizontal first order x-oriented frame width $w_{1xh}$ is one less than the base frame width $w_0$ ($w_{1xv}=w_0-1$). FIG. 6L is an illustration of a frame shaped first order y-oriented interstitial filling dosage pattern $I_{1y}(X,Y)$. Note that the frame shaped first order y-oriented interstitial filling dosage pattern $I_{1y}(X,Y)$ illustrated in FIG. 6K has two different frame widths: a horizontal first order y-oriented frame width $w_{1yh}$ that is five pixels wide along the top and bottom edges; and a vertical first order x-oriented frame width $w_{1yv}$ that is four pixels wide the right and left edges. In general, the vertical first order y-oriented frame width $w_{1yv}$ is one less than the base frame width $w_0$ ($w_{1yv}=w_0-1$). In general, the horizontal first order y-oriented frame width $w_{1yh}$ is equal to the base frame width $w_0$ ($w_{1yv}=w_0$).

The frame shaped base pattern $I_0(X,Y)$ illustrated in FIG. 6I has a constant base frame width $w_0$, this is done for illustrative purposes. In an alternative embodiment the base frame $w_0(X,Y)$ varies with position on the frame in which case other frame widths ($w_2, w_{1xh}, w_{1xv}, w_{1yh}$, and $w_{1yv}$) also vary with position but are related to the nearest frame width as described by equations (1) below. In an embodiment, the frame shaped dosage patterns are all controlled by frame shaped modulation maps, each of these frame shaped modulation maps has a corresponding frame width that is the same as frame width of dosage pattern. Each of the frame widths are a function of the frame widths are related to each other and may be a function of the frame width of the base pattern frame width as describe in equation (1) below.

$$w_2(X,Y)=w_0(X,Y)-1$$

$$w_{1xh}(X,Y)=w_0(X,Y)-1$$

$$w_{1xv}(X,Y)=w_0(X,Y)$$

$$w_{1yh}(X,Y)=w_0(X,Y)$$

$$w_{1yv}(X,Y)=w_0(X,Y)-1 \quad (1)$$

For each imprint field there is a set of dosage patterns I ($I=\{I_0, I_2, I_{1x}, I_{1y}\}$) that are directed towards the imprint field with a set of duty cycles c ($c=\{c_0, c_{1x}, c_{1y}, c_2\}$) to achieve a simulated dose D as described in equation (2a). In an alternative embodiment, the duty cycles associated with both subsets of the first order interstitials ($c_{1x}=c_{1y}=c_1$) is the same as described in equation (2b). In an embodiment, the desired dose is uniform with a sharp edge. In an embodiment, each imprint field is illuminated with a set of these four dosage patterns in the set of dosage patterns I.

$$D(X,Y)=c_0*I_0(X,Y)+c_{1x}*I_{1x}(X,Y)+c_{1y}*I_{1y}(X,Y)+c_2*I_2(X,Y)$$

$$c_0+c_{1x}+c_{1y}+c_2=1 \quad (2a)$$

$$D(X,Y)=c_0*I_0(X,Y)+c_1*(I_{1x}(X,Y)+I_{1y}(X,Y))+c_2*I_2(X,Y)$$

$$c_0+2c_1+c_2=1 \quad (2b)$$

The amount of time that is used to expose the formable material to each dosage pattern $I_i$ is proportional to the associated duty cycle $c_i$. The amount of time that is used to expose the formable material to base pattern $I_0$ is proportional to the base pattern duty cycle $c_0$. The amount of time that is used to expose the formable material to first order X-oriented interstitial filling dosage pattern $I_{1x}(X, Y)$ is proportional to the first order X-oriented duty cycle $c_{1x}$. The amount of time that is used to expose the formable material to first order y-oriented interstitial filling dosage pattern $I_{1y}(X, Y)$ is proportional to the first order y-oriented duty cycle $c_{1y}$. The amount of time that is used to expose the formable material to either of the first order X-oriented interstitial filling dosage pattern $I_{1x}(X, Y)$ and the first order Y-oriented interstitial filling dosage pattern $I_{1y}(X, Y)$ is proportional to the first order duty cycle $c_1$. The amount of time that is used to expose the formable material to either of the second order interstitial filling dosage pattern $I_2(X, Y)$ is proportional to the second order duty cycle $c_2$.

FIG. 7A is an illustration of a first set of duty cycles c {10/28; 5/28; 5/28; 8/28} used to generate a simulated dose D as shown in FIG. 7B. FIG. 7C is an illustration of cross sections of the simulated dose D. The applicant has identified that using a set of patterns with SLM position shifts and duty cycles as described above, the interstitial intensity non-uniformity is significantly reduced. For example, the variation of the intensity in the inner part of the dosage pattern D across the 3×3 map is less than 40% of the maximum intensity as illustrated in FIG. 7C. This is a significant improvement compared to the intensity drops observed in the interstitials which is greater than 90% as illustrated in FIG. 6D when using a single base pattern $I_0$ to cure the desired region. This is sufficient to reduce most of the problems related to curing non-uniformity and its impact on the defect inspection and etch performance.

FIG. 7D is an illustration of a second set of duty cycles c {10/33; 7/33; 7/33; 9/33} used to generate a simulated dose D as shown in FIG. 7E. FIG. 7F is an illustration of cross sections of the simulated dose D.

FIG. 7G is an illustration of a second set of duty cycles c {1/4; 1/4; 1/4; 1/4} used to generate a simulated dose D as shown in FIG. 7H. FIG. 7I is an illustration of cross sections of the simulated dose D.

The applicant has observed that increasing the first order duty cycles ($c_{1x}, c_{1y}, c_1$) and second order duty cycles ($c_2$) up to the same duty cycle of the base pattern ($c_0$) leads to a reduction in the non-uniformity in the desired curing region, as can be observed from the simulations illustrated in FIGS. 7A-I. The variation in the dosage due to the interstitials 664 can be significantly reduced by modulating the duty cycle until dose non-uniformity does not significantly affect the curing of the formable material. The dosage at the second order interstitials 664c can be increased to over 80% of the maximum intensity (see FIG. 7I) across the 3×3 region compared to less than 10% intensity (see FIG. 6D) in the second order interstitials 664c when only using base pattern for the whole exposure duration.

These four patterns ($I_0$; $I_{1x}$; $I_{1y}$; and $I_2$) are exemplary embodiments of predicted dosage patterns produced by a first set of modulation maps that may be used. A second set different from the first set of modulation maps may be used along with corresponding positional shifts and duty cycles to meet the blur and uniformity requirements of the desired curing dose. A numerical optimization process can be used to determine: a set of modulation maps $\mathbb{M}$ that includes a plurality of individual $M_i$ modulation maps; a set of positional shifts $\Delta$ including a plurality of positional shifts of an array of illuminators ($\Delta_i(\Delta x_i, \Delta y_i)$); and a set of duty cycles $c$ including a plurality of duty cycles ($c_i$) that would minimize the dosage non-uniformity in the desired curing area as described below.

Each modulation map element $M_{i,j,k}$ of modulation map $M_i$ represents a modulation value associated with a pixel j,k of the SLM 448 during duty cycle $c_i$ while the position has been shifted by positional shift $\Delta_i$. In which modulation map element $M_{i,j,k}$ has a value of 0 or 1. A modulation value of 0 represents that a minimal amount of radiation incident on an individual pixel is directed towards the formable material and a value of 1 represents that the pixel directs the maximum amount of incident radiation towards the formable material. In an alternative embodiment, the modulation values $M_{i,j,k}$ have a set of discrete values between 0 and 1 and represent total dosage supplied by pixel j,k when it has been shifted by positional shift $\Delta_i$. The total dosage may be adjusted by adjusting the intensity or the time duration of the exposure.

Equation (3) below describes an exemplary method of estimating a simulated dose D(X,Y) based on a set of operational parameters O. The index i as used in the following portions of the specification is not in reference to the imprint field i as discussed above but is instead an index used to identify an element in a set. A particular set of operational parameters O may include: a particular set of modulation maps $\mathbb{M}$; a particular set of duty cycles c; a particular set of positional shifts $\Delta$ (O={$\mathbb{M}$, c, $\Delta$}). In equation (3) the estimated intensity distribution $(G_{j,k})(x_j, y_k)$ is the intensity of actinic radiation at the plane of the formable material due to a particular pixel j,k. The estimated intensity distribution $(G_{j,k})$ for each particular pixel is centered on the center of each modulation element $(x_j, y_k)$. The centers of each modulation element are related to the general coordinate system based on the pixel pitch ($x_j = X + j^* p_x$, $y_k = Y + k^* p_x$). The pixel pitches at the plane of the formable material are $p_x$ and $p_y$. In an embodiment, the pixel pitch along both axes may be equal ($p = p_x = p_y$). In an embodiment, the estimated intensity distribution $(G_{j,k})(x_j, y_k)$ is independent of the particular pixel j,k besides being centered at center of the modulation element. In an embodiment, the estimated intensity distribution is independent of the particular pixel j,k. In an embodiment, the estimated intensity distribution $G_{j,k}(x_j, y_k)$ is a 2-dimensional gaussian function. In an embodiment, the estimated intensity distribution is experimentally determined based on a measured intensity at the plane of the formable material. In an embodiment, the estimated intensity distribution is a convolution of the point spread function of the imaging system used to form an image of the SLM at the plane of the formable material and an image of a representative SLM modulation element.

$$D(X,Y) = \sum_i c_i * I_i(X,Y) = c \cdot I \quad (3)$$

$$I_i(X,Y) = \sum_{j=1}^{m} \sum_{k=1}^{n} M_{i,j,k} * G_{j,k}(x_j + \Delta x_i, y_k + \Delta y_i)$$

In an embodiment, a curing dose variation metric H may be calculated for each simulated dose D. Equation (4a) represents an exemplary method of calculating the curing dose variation metric. In an embodiment, maximum and minimum values are calculated over the range of the imprint field. In an embodiment, maximum and minimum values are calculated over a subset of the range of the imprint field. The imprint field may have a range A that covers the entire area under the mesa 110. The subset range $A_s$ is inset by an inset width within the range A, and the dose variation metric H may be calculated over that subset range $A_s$ as described in equation (4b). In an embodiment, each of the modulation maps $M_i$ have a frame shape and subset range $A_s$ also has a frame shape that is inset by an inset width within both inner and outer edges of the area covered by the frame shaped modulation maps. In an embodiment, the inset width is one of: the blur width b of a predicted dosage pattern or a multiple of the pixel pitch. The multiple of the pixel pitch may be for example 0.5, 1 and 2.

$$H = \frac{\left( \max_{X,Y}(D(X,Y)) - \min_{X,Y} D(X,Y) \right)}{\max_{X,Y}(D(X,Y))} \quad (4a)$$

$$H = \frac{\left( \max_{A_s}(D(X,Y)) - \min_{A_s} D(X,Y) \right)}{\max_{A_s}(D(X,Y))} \quad (4b)$$

In an embodiment, the curing dose variation metric H is calculated for a plurality of different sets of operational parameters O. Equations (3) and (4) may be written to cover an operational parameters superset $\mathbb{O}$ that includes multiple sets of operational parameters $O_a$ as described in equation (5a) below in which the curing dose variation metric $H_a$ is calculated for various sets of operational parameters $O_a$.

$$O_a = \{\mathbb{M}_a c_a \Delta_a\} \quad \mathbb{O} = \{O_a | a \in \mathbb{Z}^+\}$$

$$D_a(X,Y,O_a) = \sum_i c_{i,a} * I_{i,a}(X,Y) = c_a \cdot I_a$$

$$I_{i,a}(X,Y,O_a) = \sum_{j=1}^{m} \sum_{k=1}^{n} M_{i,j,k,a} * G_{j,k}(x_j + \Delta x_{i,a}, y_k + \Delta y_{i,a}) \quad (5a)$$

$$H_a(O_a) = \frac{\left( \max_{X,Y}(D_a(X,Y,O_a)) - \min_{X,Y}(D_a(X,Y,O_a)) \right)}{\max_{X,Y}(D_a(X,Y,O_a))}$$

$$H_a(O_a) = \frac{\left( \max_{A_s}(D_a(X,Y,O_a)) - \min_{A_s}(D_a(X,Y,O_a)) \right)}{\max_{A_s}(D_a(X,Y,O_a))} \quad (5b)$$

In an embodiment, a set of operational parameters $O_a$ is selected for use in the shaping process 300 in which the curing dose variation metric is compared to a variation threshold $H_{threshold}$ as described in equation (6) below. The variation threshold $H_{threshold}$ may be determined experimentally by producing a plurality of cured films 524 with variety of set of operational parameters $O_a$ producing a variety of curing dose variation metrics $H_a$. The plurality of cured films are inspected to determine if the etching performance is impacted and/or if the inspection performance is impacted. The variation threshold $H_{threshold}$ is selected which has selected which has an acceptable impact on inspection and/or etching performance. The variation threshold $H_{threshold}$ may be 0.2 0.3 0.4 0.5. In an alternative embodiment, an $O_a$ is selected which minimizes $H_a$.

$$H_a(O_a) < H_{threshold} \quad (6)$$

Method for Selecting a Set of Illumination Patterns

Figure 8:
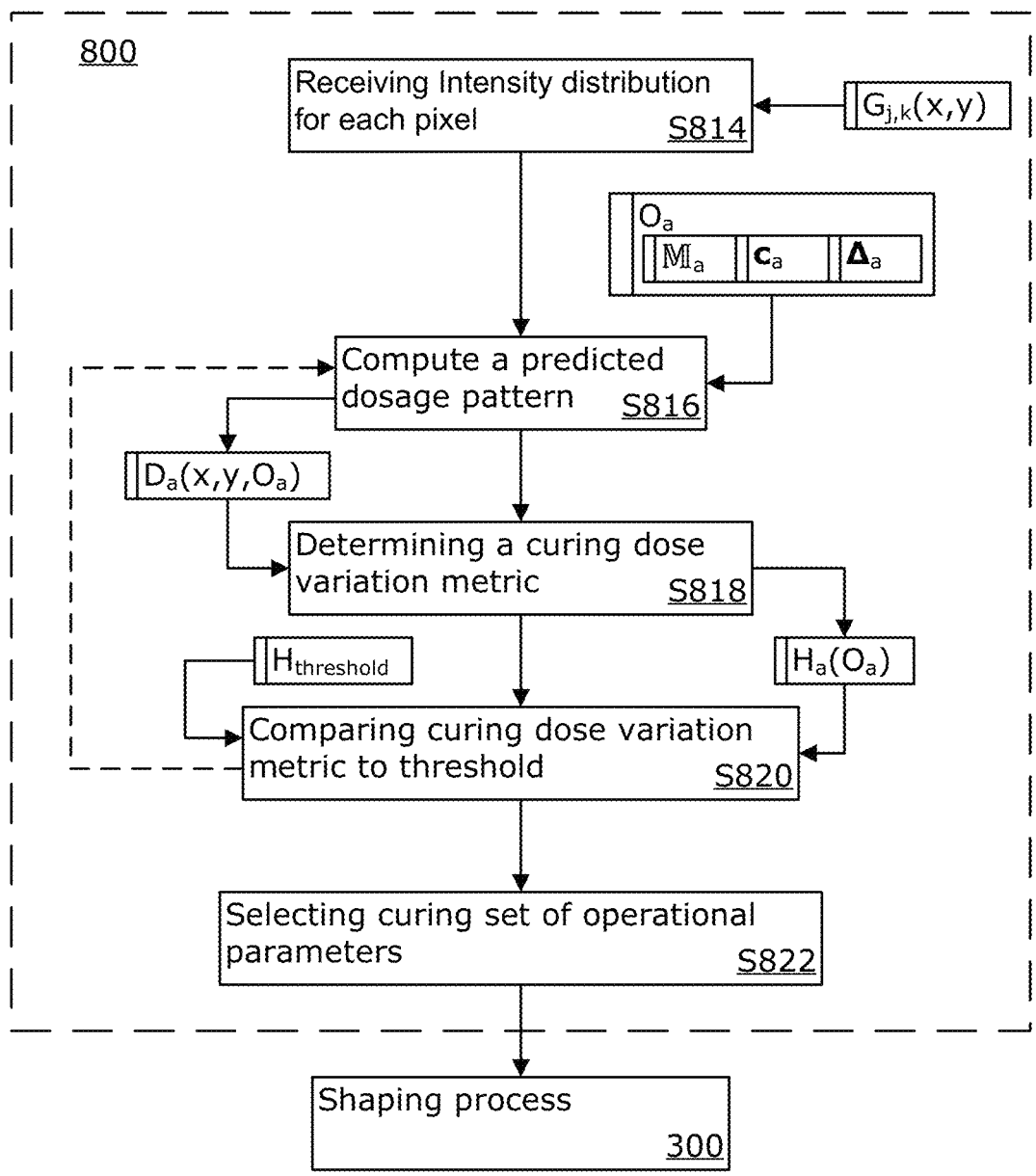
FIG. 8 is a flowchart illustrating an operational parameter selection process as used in an embodiment.

The shaping process 300 uses a set of illumination patterns that are passed through the shaping surface 112 during the curing step S308. The set of illumination patterns are generated using a curing set of operational parameters. The curing set of operational parameters are selected using an operational parameter selection process 800 as illustrated in FIG. 8 which may be executed by one or more processors 140.

The operational parameter selection process 800 may include a receiving step S814. During the receiving step S814 the processor 140 may receive intensity distribution information G that represents an intensity distribution for each pixel in an array of pixels of actinic radiation that is projected at a plane of the shaping surface while it is in contact with formable material on a substrate. The intensity distribution information G may be one or more of: a set of parameters; a function; and an array of values. The intensity distribution information G may be identical for each pixel or may vary with the pixel address.

The operational parameter selection process 800 may include a computing step S816. During the computing step S816 the processor 140 may compute a predicted dosage pattern D. The predicted dosage pattern D may be based on the intensity distribution G for each pixel and a set of operational parameters O. The set of operational parameters O may include: a set of modulation maps $\mathbb{M}$; a set of positional shifts of an array of illuminators $\Delta$; and a set of duty cycles c. In an embodiment, the processor 140 may implement a method of computing the predicted dosage pattern D using equation (3) described above.

The operational parameter selection process 800 may include a determining step S818. During the determining step S818 the processor 140 may determine a curing dose variation metric H. The curing dose variation metric H is a metric that represents non-uniformity of the dosage pattern D in the internal part of the imprint field. In an embodiment, the processor 140 may implement a method of determining the curing dose variation metric H using equation (4) described above.

The operational parameter selection process 800 may include a comparison step S820. During the comparison step S820 the processor 140 may compare the curing dose variation metric H to a variation threshold $H_{threshold}$ as described in equation (6) above. The variation threshold $H_{threshold}$ may be supplied by a user and may be calculated based on experiments. After the comparison step S820, steps S816, S818, and S820 may be repeated multiple times using different sets of operational parameters $O_a$ so as to create an operational parameters superset $\mathbb{O}$ and a corresponding set of curing dose variation metrics H.

The operational parameter selection process 800 may include a selection step S822. During the selection step S822 the processor 140 may identify a curing set of operational parameters in the operational parameters superset $\mathbb{O}$ in which the curing dose variation metric $H_a$ that is below a dose variation threshold $H_{threshold}$. During the selection step S822 the processor 140 may compare a curing dose variation metric H to a dose variation threshold $H_{threshold}$. This comparison may be used by the processor 140 to identify a curing set of operational parameters which is then used during the curing step S308 by the shaping system 100. In an alternative embodiment, the simulated dose D may be also tested using other metrics that measure it's suitability as curing dose. An example of the other metrics is the blur width variation along the imprint field edges.

The operational parameter selection process 800 may output the curing set of operational parameters to be used during the curing step S308 of the shaping process.

In an embodiment, the processors 140 performs the computing step S816 repeatedly with a plurality of different sets of operational parameters $O_a$. In which the set of duty cycles $c_a$ varies in each of the set of operational parameters $O_a$ in the operational parameters superset $\mathbb{O}$ and other operational parameters are kept constant ($\mathbb{O} = \{\{\mathbb{M}, c_a, \Delta\} | a \in \mathbb{Z}^\pm\}$). For example, the set of modulation maps $\mathbb{M}$ is identical in the each of the set of operational parameters in the operational parameters superset $\mathbb{O}$. Also, the set of positional shifts $\Delta$ is identical in the each of the set of operational parameters in the operational parameters superset $\mathbb{O}$.

In an embodiment, the operational parameters superset $\mathbb{O}$ may include: a set of modulation maps $\mathbb{M}$ that includes four modulation maps ($\mathbb{M} = \{M_0, M_{1x}, M_{1y}, M_2\}$) and a set of positional shifts $\Delta$ that includes four positional shifts ($\Delta = \{\Delta_0, \Delta_{1y}, \Delta_{1x}, \Delta_2\}$). In an embodiment, a base modulation map $M_0$ is a m×n digital map; a first order x-oriented modulation map $M_{1x}$ is a (m−1)×n digital map; a first order y-oriented modulation map $M_{1y}$ is a m×(n−1) digital map; and the second order modulation map $M_2$ is (m−1)×(n−1) digital map. In an embodiment, a base positional shift $\Delta_0$ is zero; a first order x-oriented positional shift $\Delta_{1x}$ is a half pitch x-shift and a zero y-shift; a first order y-oriented positional shift $\Delta_{1y}$ is a zero x-shift and a half pitch y-shift; and the second order positional shift $\Delta_2$ is a half pitch x-shift and a half pitch y-shift.

In an embodiment, the curing step S308 includes repeatedly shifting the array of illuminators (for example the SLM 448) based on a particular element in the set of positional shifts $\Delta$. The curing step S308 also includes illuminating the shaping surface 112 based on a particular map $M_i$ in the superset of modulation maps $\mathbb{M}$ for a period of time determined by a particular duty cycle element $c_i$ in the set of duty cycles c. The processor 140 will send signals to the SLM 448 via a controller with a pattern based on the modulation maps $M_i$ for period of times that is determined by the duty cycle $c_i$.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. A method for generating a set of illumination patterns to be passed through a shaping surface using a curing set of operational parameters comprising:
    (a) receiving an intensity distribution for each pixel in an array of pixels of actinic radiation that is projected at a plane of the shaping surface while it is in contact with formable material on a substrate;
    (b) computing a predicted dosage pattern based on the intensity distribution for each pixel and a set of operational parameters including:
        a set of modulation maps;
        a set of positional shifts of an array of illuminators; and
        a set of duty cycles;
    (c) determining a curing dose variation metric based on the predicted dosage pattern;
    (d) comparing the curing dose variation metric to a threshold; and
    (e) performing steps (b)-(d) using different sets of operational parameters to create an operational parameters superset; and
    (f) selecting the curing set of operational parameters in the operational parameters superset in which the curing dose variation metric is compared to a dose variation threshold,
    wherein the set of duty cycles varies in each of the set of operational parameters in the operational parameters superset,
    wherein the set of modulation maps is identical in the each of the set of operational parameters in the operational parameters superset, and
    wherein the set of positional shifts is identical in the each of the set of operational parameters in the operational parameters superset.

2. The method of claim 1 wherein the array of illuminators is a DMD array illuminated with actinic radiation.

3. The method of claim 1 wherein the array of illuminators is an LED array that supplies actinic radiation.

4. The method of claim 1 wherein the operational parameters superset comprises:
    the set of modulation maps comprises:
        a m×n digital map;
        a (m−1)×(n−1) digital map;
        a m×(n−1) digital map; and
        a (m−1)×n digital map; and
    set of positional shifts of an array of illuminators comprises:
        a zero x-shift and a zero y-shift;
        a half pitch x-shift and a half pitch y-shift;
        the half pitch x-shift and the zero y-shift; and
        the zero x-shift and the half pitch y-shift.

5. The method of claim 1, further comprising:
    (g) bringing a shaping surface into contact with formable material on the substrate;
    (h) shifting the array of illuminators based on a particular element in the set of positional shifts;
    (i) illuminating the shaping surface based on a particular map in the set of modulation maps for a period of time determined by a particular duty cycle element in the set of duty cycles;
    (j) repeating steps (h) and (i) for the set of parameters; and
    (k) separating the shaping surface from the formable material.

6. A method of manufacturing an article, from a substrate on which a film was shaped according to the method of claim 5, further comprising:
    processing the device-yielding substrate; and
    forming the article from the processed device-yielding substrate.

7. The method of claim 1, further comprising transmitting the curing set of operational parameters from a first processor to a controller of a shaping system, that is used by the shaping system to shape surfaces on a substrate.

8. The method of claim 1, further comprising:
    receiving a desired dosage pattern;
    wherein the step (f) of selecting the curing set of operational parameters further comprises:
        comparing the predicted dosage pattern to the desired dosage pattern.

9. The method of claim 1, wherein the curing dose variation metric Ha is calculated by:

$$H_a(O_a) = \frac{\left(\max_{A_s}(D_a(X,Y,O_a)) - \min_{A_s}(D_a(X,Y,O_a))\right)}{\max_{A_s}(D_a(X,Y,O_a))};$$

wherein $D_a$ is a simulated dose of the predicted dosage pattern;
wherein $O_a$ is a set of operational parameters; and
wherein $A_s$ is subset range that is within a range of an imprint field.

10. The method of claim 9, wherein the $A_s$ is a subset range that is an inset width within edges covered by the set of modulation maps, wherein the inset width is one of:
    a blur width b of the predicted dosage pattern; and
    a multiple of the pixel pitch.

11. The method of claim 10, wherein the set of modulation maps and the subset range $A_s$ are frame shaped modulation maps.

12. The method of claim 11, wherein the frame shaped modulation maps have frame widths that are function of position in the imprint field, wherein the frame widths of the different modulation maps are related to each other.

13. A system for generating a set of illumination patterns to be passed through a shaping surface using a curing set of operational parameters comprising:
    a memory;
    a processor configured to:
        (a) receive an intensity distribution for each pixel in an array of pixels of actinic radiation that is projected at a plane of the shaping surface while it is in contact with formable material on a substrate;
        (b) compute a predicted dosage pattern based on the intensity distribution for each pixel and a set of operational parameters including:
        a set of modulation maps;
        a set of positional shifts of an array of illuminators; and
        a set of duty cycles;
        (c) determine a curing dose variation metric based on the predicted dosage pattern;
        (d) compare the curing dose variation metric to a threshold; and
        (e) perform steps (b)-(d) using different sets of operational parameters to create an operational parameters superset; and
        (f) select the curing set of operational parameters in the operational parameters superset in which the curing dose variation metric is compared to a dose variation threshold, wherein the set of duty cycles varies in each of the set of operational parameters in the operational parameters superset,
wherein the set of modulation maps is identical in the each of the set of operational parameters in the operational parameters superset, and
wherein the set of positional shifts is identical in the each of the set of operational parameters in the operational parameters superset.

14. The system of claim 13 further comprising:
a template chuck configured to hold a template;
a substrate chuck configured to hold the substrate;
a dispensing system configure to dispense the formable material onto a substrate;
a first positioning system configured to align the template with the substrate and bring the shaping surface of the template into contact with the formable material on the substrate;
an illumination system configured to produce an array of beamlets;
a second positioning system configured to shift the array of beamlets relative to the template by an amount that is less than a pixel width of the array of beamlets;
wherein the second positioning system is configured to shift the array of illuminators based on a particular element in the set of positional shifts of the selected curing set of operational parameters;
wherein the illumination system is configured to illuminate the shaping surface based on a particular map in the set of modulation maps for a period of time determined by a particular duty cycle element in the set of duty cycles of the selected curing set of operational parameters;
wherein the second positioning system and the illumination system are configured to repeat shifting and illuminating for the set of parameters; and
first positioning system is configured to separate the shaping surface from the formable material.

15. The system of claim 13 further comprising:
a shaping system configured to shape a film on a substrate with the template;
the shaping system further configured to cure the formable material in contact with the template using the selected curing set of operational parameters.

* * * * *